United States Patent
Ma et al.

(10) Patent No.: US 11,637,570 B2
(45) Date of Patent: *Apr. 25, 2023

(54) DECODING METHOD AND APPARATUS AND DEVICE

(71) Applicant: HUAWEI TECHNOLOGIES CO., LTD., Guangdong (CN)

(72) Inventors: Liang Ma, Shanghai (CN); Hang Li, Shanghai (CN); Yuejun Wei, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/320,636

(22) Filed: May 14, 2021

(65) Prior Publication Data

US 2021/0273661 A1 Sep. 2, 2021

Related U.S. Application Data

(63) Continuation of application No. PCT/CN2019/117004, filed on Nov. 11, 2019.

(30) Foreign Application Priority Data

Nov. 16, 2018 (CN) .......................... 201811369277.6

(51) Int. Cl.
*H03M 13/45* (2006.01)
(52) U.S. Cl.
CPC .................. *H03M 13/45* (2013.01)
(58) Field of Classification Search
CPC ............. H03M 13/45; H03M 13/6502; H03M 13/6561; H03M 13/13; H03M 13/1105; H03M 13/1125
See application file for complete search history.

(56) References Cited

U.S. PATENT DOCUMENTS

| 10,615,825 | B2 | 4/2020 | Sarkis et al. |
| 2013/0117344 | A1 | 5/2013 | Gross et al. |

(Continued)

FOREIGN PATENT DOCUMENTS

| CN | 104124979 A | 10/2014 |
| CN | 105281785 A | 1/2016 |

(Continued)

OTHER PUBLICATIONS

Extended European Search Report issued in European Application No. 19884445.8 dated Oct. 28, 2021, 14 pages.

(Continued)

*Primary Examiner* — Thien Nguyen
(74) *Attorney, Agent, or Firm* — Fish & Richardson P.C.

(57) ABSTRACT

One example method includes obtaining $L_1$ first decoding paths of an $(i-1)^{th}$ group of to-be-decoded bits, where i is an integer, received data corresponds to P groups of to-be-decoded bits, and $1 < i \leq P$, determining at least one second decoding path corresponding to each first decoding path, where a quantity of second decoding paths corresponding to each first decoding path is less than $2^n$, and where n is a quantity of information bits included in an $i^{th}$ group of to-be-decoded bits, and determining at least one reserved decoding path of the $i^{th}$ group of to-be-decoded bits in second decoding paths corresponding to the $L_1$ first decoding paths. The at least one reserved decoding path includes a decoding result of the $i^{th}$ group of to-be-decoded bits.

20 Claims, 10 Drawing Sheets

(56) References Cited

U.S. PATENT DOCUMENTS

| | | |
|---|---|---|
| 2015/0026543 A1 | 1/2015 | Li et al. |
| 2015/0188666 A1 | 7/2015 | Mahdavifar et al. |
| 2015/0295593 A1 | 10/2015 | Trifonov et al. |
| 2016/0013810 A1* | 1/2016 | Gross ............... H03M 13/13 714/776 |
| 2017/0149531 A1* | 5/2017 | Raza ............... H03M 13/37 |
| 2017/0230059 A1* | 8/2017 | Giard ............... H03M 13/2927 |
| 2017/0366199 A1* | 12/2017 | Ge ............... H04L 1/0053 |
| 2017/0366204 A1* | 12/2017 | Shi ............... H04L 25/061 |
| 2018/0019766 A1 | 1/2018 | Yang et al. |
| 2018/0083655 A1* | 3/2018 | El-Khamy ............... H01L 22/10 |
| 2018/0270017 A1 | 9/2018 | Lin et al. |
| 2018/0323810 A1* | 11/2018 | Sarkis ............... H04L 1/0045 |
| 2018/0323905 A1* | 11/2018 | Shelby ............... H04L 1/0058 |
| 2018/0331697 A1* | 11/2018 | Lin ............... H03M 13/6502 |
| 2020/0036477 A1* | 1/2020 | Xu ............... H03M 13/2906 |
| 2020/0099393 A1* | 3/2020 | Xu ............... H03M 13/2927 |
| 2021/0152191 A1* | 5/2021 | Sarkis ............... H03M 13/09 |
| 2021/0184701 A1* | 6/2021 | Ma ............... H03M 13/6561 |

FOREIGN PATENT DOCUMENTS

| | | |
|---|---|---|
| CN | 105515590 A | 4/2016 |
| CN | 106253911 A | 12/2016 |
| CN | 106487479 A | 3/2017 |
| CN | 106656205 A | 5/2017 |
| CN | 106877884 A | 6/2017 |
| CN | 107040262 A | 8/2017 |
| CN | 107534448 A | 1/2018 |
| CN | 107896137 A | 4/2018 |
| CN | 108063649 A | 5/2018 |
| CN | 108347302 A | 7/2018 |
| CN | 108462558 A | 8/2018 |
| WO | 2017082626 A1 | 5/2017 |
| WO | 2018191908 A1 | 10/2018 |

OTHER PUBLICATIONS

Han et al., "Simplified multi-bit SC list decoding for polar codes," 2016 IEEE International Conference on Acoustics, Speech and Signal Processing (ICASSP), Mar. 20, 2016, 5 pages.

Hashemi et al., "Partitioned successive-cancellation list decoding of polar codes," 2016 IEEE International Conference on Acoustics, Speech and Signal Processing (ICASSP), Mar. 20, 2016, 4 pages.

Xiong et al., "Symbol-Decision Successive Cancellation List Decoder for Polar Codes," IEEE Transactions on Signal Processing, volo. 64, No. 3, Feb. 2016, 13 pages.

Xu et al., "A complexity-reduced fast successive cancellation list decoder for polar codes," Science China Information Sciences, vol. 61, No. 2, Feb. 2018, 11 pages.

Yuan et al., "Low-Latency Successive-Cancellation List Decoders for Polar Codes With Multibit Decision," IEEE Transactions on Very Large Scale Integration (VLSI) Systems, vol. 23, No. 10, Oct. 2015, 13 pages.

PCT International Search Report and Written Opinion in International Application No. PCT/CN2019/117004, dated Feb. 6, 2020, 15 pages.

Office Action in Chinese Application No. 201811369277.6, dated May 24, 2021, 26 pages.

Xiong et al., "Symbol-Decision Successive Cancellation List Decoder for Polar Codes," IEEE Transactions on Signal Processing, vol. 64, No. 3, Feb. 1, 2016, 13 pages.

Yuan et al., "Low-Latency Successive-Cancellation List Decoders for Polar Codes With Multibit Decision," IEEE Transactions on Very Large Scale Integration Systems, vol. 23, No. 10, Oct. 2015.

\* cited by examiner

| | | | | | | | | | |
|---|---|---|---|---|---|---|---|---|---|
| 3.125 | 1.1756 | 0.7751 | 0.4465 | 0.2127 | 0.0371 | 0.0089 | 0.0023 | 0 | ... |
| 3.125 | 1.0985 | 0.2704 | 0.0693 | 0.0086 | 0.0034 | 0.0011 | 0 | 0 | ... |
| 3.125 | 0.9513 | 0.1775 | 0.0464 | 0.0025 | 0.001 | 0 | 0 | 0 | ... |
| 3.125 | 0.8579 | 0.1345 | 0.041 | 0.0013 | 0 | 0 | 0 | 0 | ... |
| 3.125 | 0.7629 | 0.1048 | 0.0339 | 0 | 0 | 0 | 0 | 0 | ... |
| 3.125 | 0.6903 | 0.0828 | 0.0285 | 0 | 0 | 0 | 0 | 0 | ... |
| 3.125 | 0.6225 | 0.066 | 0.0225 | 0 | 0 | 0 | 0 | 0 | ... |
| 3.125 | 0.559 | 0.0513 | 0.018 | 0 | 0 | 0 | 0 | 0 | ... |
| 3.125 | 0.4899 | 0.0378 | 0.0132 | 0 | 0 | 0 | 0 | 0 | ... |
| 3.1249 | 0.4515 | 0.0286 | 0.0102 | 0 | 0 | 0 | 0 | 0 | ... |
| 3.1248 | 0.4023 | 0.0221 | 0.0078 | 0 | 0 | 0 | 0 | 0 | ... |
| 3.1244 | 0.3565 | 0.149 | 0.0053 | 0 | 0 | 0 | 0 | 0 | ... |
| 3.123 | 0.3157 | 0.0111 | 0.0038 | 0 | 0 | 0 | 0 | 0 | ... |
| 3.12 | 0.2712 | 0.0077 | 0.0028 | 0 | 0 | 0 | 0 | 0 | ... |
| 3.1134 | 0.2318 | 0.0053 | 0.0019 | 0 | 0 | 0 | 0 | 0 | ... |
| 3.0991 | 0.1993 | 0.0032 | 0.0011 | 0 | 0 | 0 | 0 | 0 | ... |
| 3.0725 | 0.1534 | 0.0019 | 0 | 0 | 0 | 0 | 0 | 0 | ... |
| 3.0305 | 0.1326 | 0.0014 | 0 | 0 | 0 | 0 | 0 | 0 | ... |
| 2.964 | 0.1057 | 0 | 0 | 0 | 0 | 0 | 0 | 0 | ... |
| 2.897 | 0.0844 | 0 | 0 | 0 | 0 | 0 | 0 | 0 | ... |
| 2.7683 | 0.0633 | 0 | 0 | 0 | 0 | 0 | 0 | 0 | ... |
| 2.658 | 0.0481 | 0 | 0 | 0 | 0 | 0 | 0 | 0 | ... |
| 2.5363 | 0.0366 | 0 | 0 | 0 | 0 | 0 | 0 | 0 | ... |
| 2.3984 | 0.0279 | 0 | 0 | 0 | 0 | 0 | 0 | 0 | ... |
| 2.2445 | 0.0169 | 0 | 0 | 0 | 0 | 0 | 0 | 0 | ... |
| 2.1568 | 0.0149 | 0 | 0 | 0 | 0 | 0 | 0 | 0 | ... |
| 2.0851 | 0.0118 | 0 | 0 | 0 | 0 | 0 | 0 | 0 | ... |
| 1.9628 | 0.008 | 0 | 0 | 0 | 0 | 0 | 0 | 0 | ... |
| 1.9118 | 0.0056 | 0 | 0 | 0 | 0 | 0 | 0 | 0 | ... |
| 1.7417 | 0.0032 | 0 | 0 | 0 | 0 | 0 | 0 | 0 | ... |
| 1.4226 | 0 | 0 | 0 | 0 | 0 | 0 | 0 | 0 | ... |
| 1.2107 | 0 | 0 | 0 | 0 | 0 | 0 | 0 | 0 | ... |

FIG. 8

DECODING METHOD AND APPARATUS AND DEVICE

CROSS-REFERENCE TO RELATED APPLICATIONS

This application is a continuation of International Application No. PCT/CN2019/117004, filed on Nov. 11, 2019, which claims priority to Chinese Patent Application No. 201811369277.6, filed on Nov. 16, 2018. The disclosures of the aforementioned applications are hereby incorporated by reference in their entireties.

TECHNICAL FIELD

This application relates to the field of communications technologies, and in particular, to a decoding method and apparatus and a device.

BACKGROUND

In the field of communications technologies, a communications device (for example, a terminal device or a base station) may perform channel coding and decoding by using a polar code.

In a current technology, when decoding is performed by using the polar code, a process of performing decoding by using a parallel method based on a successive cancellation list (SCL) algorithm is usually as follows: dividing to-be-decoded bits into a plurality of groups of bits, and sequentially decoding each group of bits. Each time a group of bits is decoded, a plurality of decoding paths are obtained through extension, and a specific quantity of paths are reserved from the plurality of decoding paths for decoding a next group of bits. Finally, a plurality of decoding result paths may be obtained, a decoding path having a highest decoding accuracy rate is selected from the plurality of decoding paths, and a decoding result on the decoding path is used as decoding output.

However, in the foregoing method, decoding speed is slow and complexity is relatively high.

SUMMARY

This application provides a decoding method and apparatus and a device, to reduce decoding complexity and improve decoding efficiency.

According to a first aspect, this application provides a decoding method. After data received by a receiving device corresponds to P (where P is an integer greater than 1) groups of to-be-decoded bits, any $i^{th}$ (where i is an integer, and $1 < i \leq P$) group in the P groups of to-be-decoded bits may be decoded in the following feasible implementation:

obtaining $L_1$ first decoding paths of an $(i-1)^{th}$ group of to-be-decoded bits; determining a second decoding path corresponding to each first decoding path; and determining at least one reserved decoding path of the $i^{th}$ group of to-be-decoded bits in second decoding paths corresponding to the $L_1$ first decoding paths, where the at least one reserved decoding path includes a decoding result of the $i^{th}$ group of to-be-decoded bits. $L_1$ is a positive integer. In the $L_1$ first decoding paths, a quantity of second decoding paths corresponding to at least one first decoding path is different from a quantity of second decoding paths corresponding to another first decoding path. A quantity of second decoding paths corresponding to each first decoding path is less than $2^n$, where n is a quantity of information bits included in the $i^{th}$ group of to-be-decoded bits.

In the foregoing process, in any $i^{th}$-step decoding ($i \geq 2$) of SCL parallel decoding, the $L_1$ first decoding paths of the $(i-1)^{th}$ group of to-be-decoded bits are first obtained, the second decoding path corresponding to each first decoding path is determined, and at least one reserved path is determined in the second decoding paths corresponding to the $L_1$ first decoding paths. Because the quantity of second decoding paths corresponding to the first decoding path is less than $2^n$, sorting complexity can be reduced by using the foregoing method, thereby improving efficiency of an SCL parallel decoding method.

In a possible implementation, when a path metric value of an $x^{th}$ first decoding path is greater than or equal to a path metric value of a $y^{th}$ first decoding path, a quantity of second decoding paths corresponding to the $x^{th}$ first decoding path is less than or equal to a quantity of second decoding paths corresponding to the $y^{th}$ first decoding path, where x is a positive integer, $1 \leq x \leq L_1$, y is a positive integer, and $1 \leq y \leq L_1$.

When a path metric value of a first decoding path is smaller, a higher probability that the first decoding path is a real decoding path is ensured. Correspondingly, a higher probability that a second decoding path corresponding to the first decoding path is a real decoding path is also ensured. Therefore, a relatively high probability that a second decoding path determined in the foregoing manner is a real decoding path is ensured.

In a possible implementation, the determining a second path corresponding to the first decoding path includes:

determining the second decoding path corresponding to the first decoding path based on a log likelihood ratio LLR array, of the first decoding path, input in $i^{th}$-step decoding, a location of a non information bit included in the $i^{th}$ group of to-be-decoded bits, and a value of the non information bit.

In a possible implementation, the determining the second decoding path corresponding to the first decoding path based on a log likelihood ratio LLR array, of the first decoding path, input in $i^{th}$-step decoding, a location of a non information bit included in the $i^{th}$ group of to-be-decoded bits, and a value of the non information bit includes:

determining a target mode based on the LLR array, of the first decoding path, input in the $i^{th}$-step decoding, the location of the non information bit included in the $i^{th}$ group of to-be-decoded bits, and the value of the non information bit; and determining the second decoding path based on the target mode and the LLR array.

In a possible implementation, the determining a target mode based on the LLR array, of the first decoding path, input in the $i^{th}$-step decoding, the location of the non information bit included in the $i^{th}$ group of to-be-decoded bits, and the value of the non information bit includes:

determining a lighted array and a symbolic parameter S based on the LLR array, the location of the non information bit, and the value of the non information bit; and determining the target mode based on the lighted array and the symbolic parameter S.

In the foregoing process, the second decoding path corresponding to the first decoding path can be determined without calculating $2^n$ third decoding paths corresponding to the first decoding path or sorting $2^n$ third decoding paths, so that efficiency of determining the second decoding path is relatively high.

In a possible implementation, $L_1=32$, $n \leq 4$, and in the 32 first decoding paths, a quantity of second decoding paths corresponding to each of four first decoding paths is 4, a quantity of second decoding paths corresponding to each of 20 first decoding paths is 2, and a quantity of second decoding paths corresponding to each of eight first decoding paths is 1.

In a possible implementation, in the 32 first decoding paths sorted in ascending order of path metric values, a quantity of second decoding paths corresponding to each of the first to fourth first decoding paths is 4, a quantity of second decoding paths corresponding to each of the fifth to $24^{th}$ first decoding paths is 2, and a quantity of second decoding paths corresponding to each of the $25^{th}$ to $32^{nd}$ first decoding paths is 1.

Probabilities that a second decoding path corresponding to each of the first to $32^{nd}$ first decoding paths is a real decoding path decrease in descending order. In addition, the quantity (4) of second decoding paths corresponding to each of the first to fourth first decoding paths is greater than the quantity (2) of second decoding paths corresponding to each of the fifth to $24^{th}$ first decoding paths; and the quantity (2) of second decoding paths corresponding to each of the fifth to $24^{th}$ first decoding paths is greater than the quantity (1) of second decoding paths corresponding to each of the $25^{th}$ to $32^{nd}$ first decoding paths. Therefore, a relatively high probability that a second decoding path determined in the foregoing manner is a real decoding path is ensured.

In a possible implementation. $L_1=32$, $n \leq 4$, and in the 32 first decoding paths, a quantity of second decoding paths corresponding to each of eight first decoding paths is 4, a quantity of second decoding paths corresponding to each of eight first decoding paths is 2, and a quantity of second decoding paths corresponding to each of 16 first decoding paths is 1.

In a possible implementation, in the 32 first decoding paths sorted in ascending order of path metric values, a quantity of second decoding paths corresponding to each of the first to eighth first decoding paths is 4, a quantity of second decoding paths corresponding to each of the ninth to $16^{th}$ first decoding paths is 2, and a quantity of second decoding paths corresponding to each of the $17^{th}$ to $32^{nd}$ first decoding paths is 1.

Probabilities that a second decoding path corresponding to each of the first to $32^{nd}$ first decoding paths is a real decoding path decrease in descending order. In addition, the quantity (4) of second decoding paths corresponding to each of the first to eighth first decoding paths is greater than the quantity (2) of second decoding paths corresponding to each of the ninth to $16^{th}$ first decoding paths; and the quantity (2) of second decoding paths corresponding to each of the ninth to 16th first decoding paths is greater than the quantity (1) of second decoding paths corresponding to each of the $17^{th}$ to $32^{nd}$ first decoding paths. Therefore, a relatively high probability that a second decoding path determined in the foregoing manner is a real decoding path is ensured.

In a possible implementation, a group of to-be-decoded bits includes four to-be-decoded bits; and when a quantity of non information bits is 1 and the non information bit occupies the first location, the lighted array includes 1111:

when a quantity of non information bits is 1 and the non information bit occupies the second location, the lighted array includes 1100, 1010, 1001, 0110, 0101, and 0011:

when a quantity of non information bits is 1 and the non information bit occupies the third location, the lighted array includes 1100, 1010, 1001, 0110, 0101, and 0011; or when a quantity of non information bits is 1 and the non information bit occupies the fourth location, the lighted array includes 1000, 0100, 0010, and 0001; and when a quantity of non information bits is 0, at least one mode includes 0000, 1000, 0100, 0010, and 1100:

when the lighted array is 1111 and S is 0, at least one mode includes 0000, 1100, 1010, 1001, and 0110:

when the lighted array is 1111 and S is 1, at least one mode includes 1000, 0100, 0010, 0001, and 1110;

when the lighted array is 1100 and S is 0, at least one mode includes 0000, 0010, 1100, 0001, and 1110;

when the lighted array is 1100 and S is 1, at least one mode includes 1000, 1010, 0100, 1001, and 0110:

when the lighted array is 1010 and S is 0, at least one mode includes 0000, 0100, 0001, and 1010:

when the lighted array is 1010 and S is 1, at least one mode includes 1000, 1100, 0010, 1001, and 0110;

when the lighted array is 1001 and S is 0, at least one mode includes 0000, 0100, 0010, 0110, and 1001;

when the lighted array is 1001 and S is 1, at least one mode includes 1000, 1100, 1010, 1110, and 0001;

when the lighted array is 0110 and S is 0, at least one mode includes 0000, 1000, 0001, 1001, 0110, and 1110;

when the lighted array is 0110 and S is 1, at least one mode includes 0100, 1100, 0010, and 1010;

when the lighted array is 0101 and S is 0, at least one mode includes 0000, 1000, 0010, and 1010;

when the lighted array is 0101 and S is 1, at least one mode includes 0100, 1100, 0110, 1110, 0001, and 1001;

when the lighted array is 0011 and S is 0, at least one mode includes 0000, 10000100, and 1100;

when the lighted array is 0011 and S is 1, at least one mode includes 0010, 1010, 0110, 1110, 0001, and 1001:

when the lighted array is 1000 and S is 0, at least one mode includes 0000, 0100, 0010, 0110, and 0001;

when the lighted array is 1000 and S is 1, at least one mode includes 1000, 1100, 1010, 1110, and 1001;

when the lighted array is 0100 and S is 0, at least one mode includes 0000, 1000, 0010, 1010, and 0001;

when the lighted array is 0100 and S is 1, at least one mode includes 0100, 1100, 0110, 1110, and 0101;

when the lighted array is 0010 and S is 0, at least one mode includes 0000, 1000, 0100, 1100, and 0001;

when the lighted array is 0010 and S is 1, at least one mode includes 0010, 1010, 0110, 1110, and 0011:

when the lighted array is 0001 and S is 0, at least one mode includes 0000, 1000, 0100, 1100, and 0010; or when the lighted array is 0001 and S is 1, at least one mode includes 0001, 1001, 0101, 1101, and 0011.

According to a second aspect, this application provides a decoding apparatus. Received data corresponds to P groups of to-be-decoded bits, and the apparatus includes an obtaining module, a first determining module, and a second determining module.

The obtaining module is configured to obtain $L_1$ first decoding paths of an $(i-1)^{th}$ group of to-be-decoded bits, where i is an integer, P is an integer greater than 1, $1 < i \leq P$, and $L_1$ is a positive integer.

The first determining module is configured to determine a second decoding path corresponding to each first decoding path, where in the $L_1$ first decoding paths, a quantity of second decoding paths corresponding to at least one first decoding path is different from a quantity of second decoding paths corresponding to another first decoding path, and a quantity of second decoding paths corresponding to each first decoding path is less than $2^n$, where n is a quantity of information bits included in an $i^{th}$ group of to-be-decoded bits.

The second determining module is configured to determine at least one reserved decoding path of the $i^{th}$ group of to-be-decoded bits in second decoding paths corresponding to the $L_1$ first decoding paths, where the at least one reserved decoding path includes a decoding result of the $i^{th}$ group of to-be-decoded bits.

In a possible implementation, when a path metric value of an $x^{th}$ first decoding path is greater than or equal to a path metric value of a $y^{th}$ first decoding path, a quantity of second decoding paths corresponding to the $x^{th}$ first decoding path is less than or equal to a quantity of second decoding paths corresponding to the $y^{th}$ first decoding path, where x is a positive integer, $1 \le x \le L_1$, y is a positive integer, and $1 \le y \le L_1$.

In a possible implementation, the first determining module is specifically configured to:

determine the second decoding path corresponding to the first decoding path based on a log likelihood ratio LLR array, of the first decoding path, input in $i^{th}$-step decoding, a location of a non information bit included in the $i^1$ group of to-be-decoded bits, and a value of the non information bit.

In a possible implementation, the first determining module is specifically configured to:

determine a target mode based on LLR array, of the first decoding path, input in the $i^{th}$-step decoding, the location of the non information bit included in the $i^{th}$ group of to-be-decoded bits, and the value of the non information bit, and determine the second decoding path based on the target mode and the LLR array.

In a possible implementation. $L_1$=32, n≤4, and in the 32 first decoding paths, a quantity of second decoding paths corresponding to each of four first decoding paths is 4, a quantity of second decoding paths corresponding to each of 20 first decoding paths is 2, and a quantity of second decoding paths corresponding to each of eight first decoding paths is 1.

In a possible implementation, in the 32 first decoding paths sorted in ascending order of path metric values, a quantity of second decoding paths corresponding to each of the first to fourth first decoding paths is 4, a quantity of second decoding paths corresponding to each of the fifth to $24^{th}$ first decoding paths is 2, and a quantity of second decoding paths corresponding to each of the $25^{th}$ to $32^{nd}$ first decoding paths is 1.

In a possible implementation, $L_1$=32, n≤4, and in the 32 first decoding paths, a quantity of second decoding paths corresponding to each of eight first decoding paths is 4, a quantity of second decoding paths corresponding to each of eight first decoding paths is 2, and a quantity of second decoding paths corresponding to each of 16 first decoding paths is 1.

In a possible implementation, in the 32 first decoding paths sorted in ascending order of path metric values, a quantity of second decoding paths corresponding to each of the first to eighth first decoding paths is 4, a quantity of second decoding paths corresponding to each of the ninth to $16^{th}$ first decoding paths is 2, and a quantity of second decoding paths corresponding to each of the $17^{th}$ to $32^{nd}$ first decoding paths is 1.

In a possible implementation, the first determining module is specifically configured to:

determine a lighted array and a symbolic parameter S based on the LLR array, the location of the non information bit, and the value of the non information bit; and determine the target mode based on the lighted array and the symbolic parameter S.

In a possible implementation, a group of to-be-decoded bits includes four to-be-decoded bits; and when a quantity of non information bits is 1 and the non information bit occupies the first location, the lighted array includes 1111;

when a quantity of non information bits is 1 and the non information bit occupies the second location, the lighted array includes 1100, 1010, 1001, 0110, 0101, and 0011;

when a quantity of non information bits is 1 and the non information bit occupies the third location, the lighted array includes 1100, 1010, 1001, 0110, 0101, and 0011; or when a quantity of non information bits is 1 and the non information bit occupies the fourth location, the lighted array includes 1000, 0100, 0010, and 0001; and when a quantity of non information bits is 0, at least one mode includes 0000, 1000, 0100, 0010, and 1100;

when the lighted array is 1111 and S is 0, at least one mode includes 0000, 1100, 1010, 1001, and 0110;

when the lighted array is 1111 and S is 1, at least one mode includes 1000, 0100, 0010, 0001, and 1110;

when the lighted array is 1100 and S is 0, at least one mode includes 0000, 0010, 1100, 0001, and 1110;

when the lighted array is 1100 and S is 1, at least one mode includes 1000, 1010, 0100, 1001, and 0110;

when the lighted array is 1010 and S is 0, at least one mode includes 0000, 0100, 0001, and 1010;

when the lighted array is 1010 and S is 1, at least one mode includes 1000, 1100, 0010, 1001, and 0110:

when the lighted array is 1001 and S is 0, at least one mode includes 0000, 0100, 0010, 0110, and 1001:

when the lighted array is 1001 and S is 1, at least one mode includes 1000, 1100, 1010, 1110, and 0001;

when the lighted array is 0110 and S is 0, at least one mode includes 0000, 1000, 0001, 1001, 0110, and 1110;

when the lighted array is 0110 and S is 1, at least one mode includes 0100, 1100, 0010, and 1010;

when the lighted array is 0101 and S is 0, at least one mode includes 0000, 1000, 0010, and 1010;

when the lighted array is 0101 and S is 1, at least one mode includes 0100, 1100, 0110, 1110, 0001, and 1001;

when the lighted array is 0011 and S is 0, at least one mode includes 0000, 1000, 0100, and 1100:

when the lighted array is 0011 and S is 1, at least one mode includes 0010, 1010, 0110, 1110, 0001, and 1001:

when the lighted array is 1000 and S is 0, at least one mode includes 0000, 0100, 0010, 0110, and 0001;

when the lighted array is 1000 and S is 1, at least one mode includes 1000, 1100, 1010, 1110, and 1001;

when the lighted array is 0100 and S is 0, at least one mode includes 0000, 1000, 0010, 1010, and 0001:

when the lighted array is 0100 and S is 1, at least one mode includes 0100, 1100, 0110, 1110, and 0101;

when the lighted array is 0010 and S is 0, at least one mode includes 0000, 1000, 0100, 1100, and 0001;

when the lighted array is 0010 and S is 1, at least one mode includes 0010, 1010, 0110, 1110, and 0011;

when the lighted array is 0001 and S is 0, at least one mode includes 0000, 1000, 0100, 1100, and 0010;

when the lighted array is 0001 and S is 1, at least one mode includes 0001, 1001, 0101, 1101, and 0011.

According to a third aspect, this application provides a decoding apparatus. The decoding apparatus includes a memory and a processor. The processor executes program instructions in the memory, to implement the decoding method according to any one of the first aspect.

According to a fourth aspect, this application provides a storage medium. The storage medium is configured to store a computer program, and the computer program is used to implement the decoding method according to any one of the first aspect.

According to the decoding method and apparatus and the device provided in this application, in any $i^{th}$-step decoding ($i \geq 2$) of SCL parallel decoding, the $L_1$ first decoding paths of the $(i-1)^{th}$ group of to-be-decoded bits are first obtained, the second decoding path corresponding to each first decoding path is determined, and at least one reserved path is determined in the second decoding paths corresponding to the $L_1$ first decoding paths. Because the quantity of second decoding paths corresponding to the first decoding path is less than $2^n$, the sorting complexity can be reduced by using the foregoing method, thereby improving the efficiency of the SCL parallel decoding method.

BRIEF DESCRIPTION OF DRAWINGS

FIG. 8 is a schematic simulation diagram according to this application;

DESCRIPTION OF EMBODIMENTS

Embodiments of this application may be used in various fields in which polar coding is used, for example, a data storage field, an optical network communications field, and a wireless communications field. A wireless communications system mentioned in the embodiments of this application includes but is not limited to a narrowband internet of things (NB-IoT) system, Wimax, a long term evolution (LTE) system, and three major application scenarios: an enhanced mobile broadband (eMBB) scenario, an ultra-reliable low-latency communication (URLLC) scenario, and a massive machine-type communications (mMTC) scenario of a next-generation 5G mobile communications system, namely, a new radio (NR) system. Certainly, there may be another field in which polar coding is used. This is not specifically limited in this application.

A communications apparatus in this application mainly comprises a network device or a terminal device. In this application, if a sending device may be a network device, a receiving device is a terminal device. In this application, if a sending device is a terminal device, a receiving device is a network device.

In the embodiments of this application, the terminal device includes but is not limited to a mobile station (MS), a mobile terminal (MT), a mobile telephone (MT), a handset, portable equipment, and the like. The terminal device may communicate with one or more core networks by using a radio access network (RAN). For example, the terminal device may be a mobile telephone (or referred to as a "cellular" telephone) or a computer having a wireless communication function. The terminal device may alternatively be a portable, pocket-sized, handheld, computer built-in, or in-vehicle mobile apparatus or device.

The embodiments are described with reference to the network device in this application. The network device may be an evolved NodeB (eNB or eNodeB) in an LTE system, or may be a gNB, a transmission reception point (TRP), a micro base station, or the like in a 5G communications system, or may be a relay station, an access point, a vehicle-mounted device, a wearable device, a network device in a future evolved public land mobile network (PLMN), a network device in a network in which a plurality of other technologies are converged, a base station in various other evolved networks, or the like.

Figure 1:
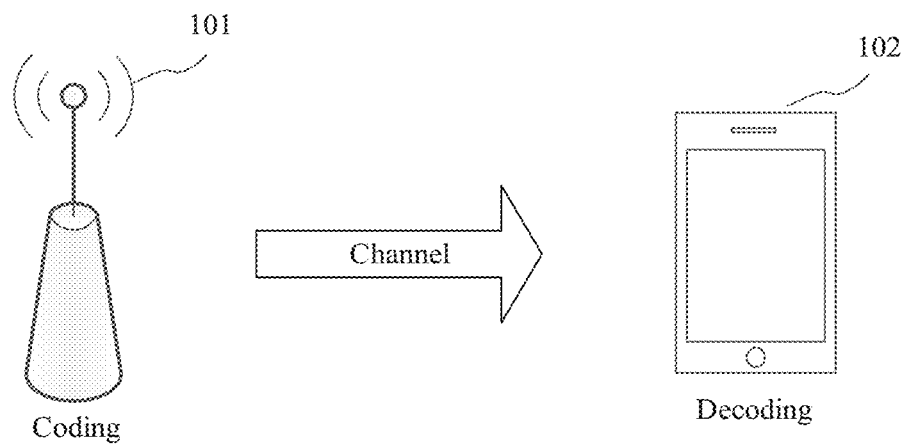
FIG. 1 is an architectural diagram of a communications system according to this application.

FIG. 1 is an architectural diagram of a communications system according to this application. Referring to FIG. 1, the communications system includes a sending device 101 and a receiving device 102.

Optionally, when the sending device 101 is a terminal device, the receiving device 102 is a network device; or when the sending device 101 is a network device, the receiving device is a terminal device.

Referring to FIG. 1, the sending device 101 includes an encoder, so that the sending device 101 can perform polar coding and output an encoded sequence. After rate matching, interleaving, and modulation, the encoded sequence is transmitted to the receiving device 102 on a channel. The receiving device 102 includes a decoder, so that the receiving device 102 can receive a signal sent by the sending device 101, and decode the received signal.

It should be noted that FIG. 1 is merely an example of an architectural diagram of a communications system, and is not a limitation on the architectural diagram of the communications system.

In a communication process, a transmit end encodes an information bit and a frozen bit, to obtain a to-be-sent bit sequence, and sends the to-be-sent bit sequence. Optionally, the frozen bit is a padding bit, and the frozen bit may usually be 0. After rate matching, interleaving, and modulation, the to-be-sent bit sequence is transmitted to a receive end through a channel. The receive end performs processing such as demodulation on the received signal, to obtain a group of log likelihood ratios (LLR), where a quantity of LLRs included in the group of LLRs is the same as a quantity of bits included in the to-be-sent bit sequence. The receive end performs polar code decoding based on the received group of LLRs. The receive end may make a misjudgment regardless of whether the transmit end sends a bit 1 or a bit 0. For a transmit bit b, at the receive end, a ratio of a probability $p(r|b=0)$ that a signal r is correctly determined as 0 to a probability $p(r|b=1)$] that a signal r is correctly determined as 1 is a likelihood ratio. For ease of calculation and processing, a natural log is used for the likelihood ratio, so that a log likelihood ratio, that is, LLR=ln[p(r|b=0)/p(r|b=1)], can be obtained. The LLR may be a floating-point number.

The following describes in detail an SCL parallel decoding method shown in this application by using specific embodiments. It should be noted that the following several embodiments may be combined with each other, and same or similar content is not described repeatedly in different embodiments.

Figure 2:
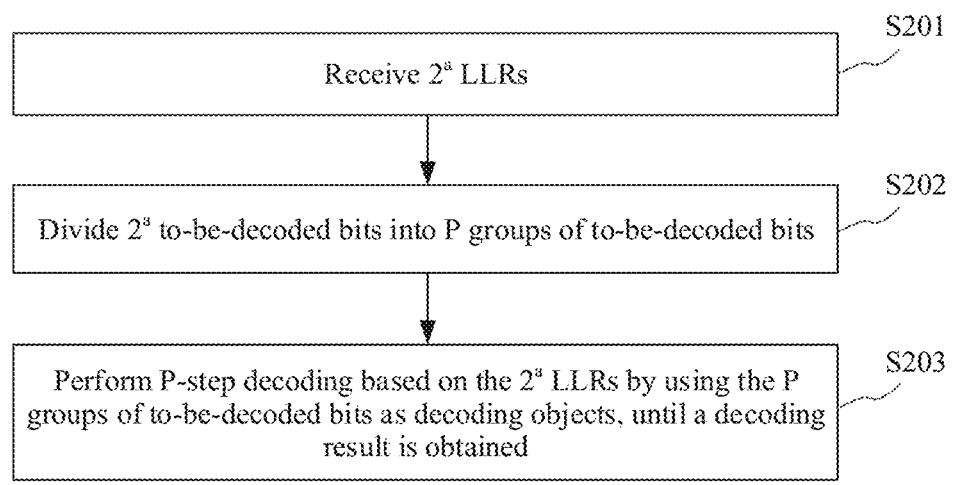
FIG. 2 is a schematic flowchart of an SCL parallel decoding method according to this application.

FIG. 2 is a schematic flowchart of an SCL parallel decoding method according to this application. Referring to FIG. 2, the method may include the following steps.

S201: Obtain $2^a$ LLRs, where a is a positive integer greater than or equal to 1.

Optionally, a receiving device receives information, and then demodulates the information, to obtain the $2^a$ LLRs.

Optionally, when a bit sequence sent by a sending device is punctured, truncated, or repeated, a quantity of LLRs received by the receiving device may be greater than or less than $2^a$. In this case, the receiving device may obtain the $2^a$ LLRs through rate matching.

Optionally, a quantity of LLRs obtained by the receiving device is the same as a quantity of bits sent by a sending device.

For example, assuming that a to-be-sent bit sequence sent by the sending device includes $2^a$ bits, the receiving device obtains the $2^a$ LLRs.

Optionally, a quantity of LLRs obtained by the receiving device is the same as a quantity of bits to be decoded by the receiving device.

For example, assuming that the receiving device obtains the $2^a$ LLRs, the receiving device needs to decode $2^a$ bits.

A decoder in the receiving device uses the $2^a$ LLRs as input for decoding.

S202: Divide $2^a$ to-be-decoded bits into P groups of to-be-decoded bits, where each group of to-be-decoded bits includes m bits, $2^a = P \times m$, P is a positive integer greater than 1, and m is a positive integer greater than or equal to 1.

Optionally, each group of to-be-decoded bits includes a to-be-decoded information bit and/or a to-be-decoded frozen bit, and the groups of to-be-decoded bits may include a same quantity of to-be-decoded information bits or different quantities of to-be-decoded information bits.

Optionally, the quantity m of bits included in each group of to-be-decoded bits may also be referred to as SCL parallel decoding parallelism.

For example, assuming that a quantity of to-be-decoded bits is 16 (that is, $2^4$), the to-be-decoded bits may be divided into P=4 groups, and each group of to-be-decoded bits includes four to-be-decoded bits.

S203: Perform P-step decoding on the P groups of to-be-decoded bits based on the $2^a$ LLRs, until a decoding result is obtained.

Optionally, a decoding result (decoding path) corresponding to first i groups of to-be-decoded bits may be obtained through $i^{th}$-step decoding in the P-step decoding, where i is an integer greater than or equal to 1 and less than or equal to P. The decoding path may be a string of decoded bit sequences obtained through bit-by-bit decoding in a decoding process, and represents a decoding result obtained through decoding attempt.

The decoding result corresponding to the first i groups of to-be-decoded bits may be implemented by performing the following step A to step C.

Step A: Calculate an $(m+1)^{th}$-layer LLR of each to-be-decoded information bit in an $i^{th}$ group of to-be-decoded bits based on the $2^a$ LLRs, where a polar code butterfly decoding network includes a+1 columns of LLRs, and the $(m+1)^{th}$-layer LLR is an LLR located in an $(m+1)^{th}$ column from left to right in the polar code butterfly decoding network.

Figure 7A:
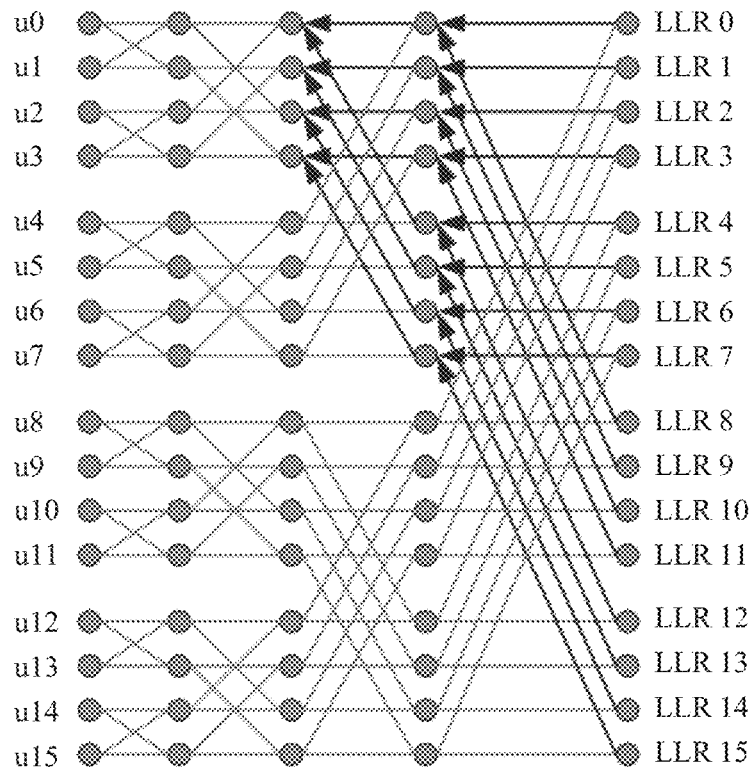
FIG. 7A is a schematic diagram of first-step decoding of SCL parallel decoding according to this application.
Figure 7B:
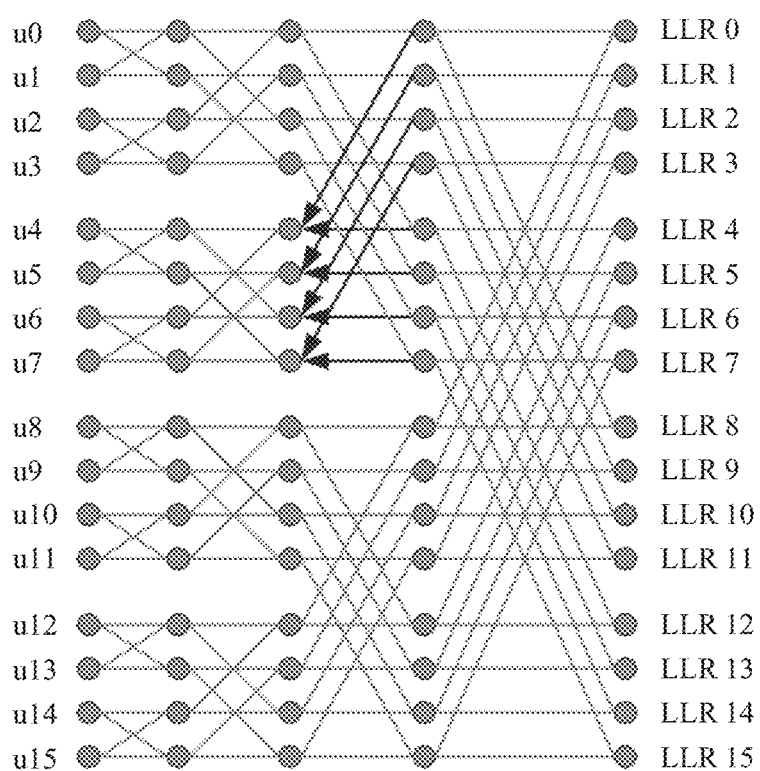
FIG. 7B is a schematic diagram of second-step decoding of SCL parallel decoding according to this application.

For example, referring to FIG. 7A and FIG. 7B, the quantity of to-be-decoded bits is $2^4$, and the polar code butterfly decoding network includes 4+1=5 columns of LLRs. The $(m+1)^{th}$-layer LLR is the LLR located in the $(m+1)^{th}$ column from left to right in the polar code butterfly decoding network.

Step B: Calculate, in parallel based on the $(m+1)^{th}$-layer LLR of each information bit in the $i^{th}$ group of to-be-decoded bits, path metric values of all possible decoding paths in the $i^{th}$-step decoding.

Optionally, an LLR of each information bit in the $i^{th}$ group of to-be-decoded bits may be calculated in parallel by using a maximum likelihood (ML) algorithm or a simplified (simplify) successive cancellation (SC) algorithm, and then the path metric values of all the possible decoding paths in the $i^{th}$-step decoding are calculated in parallel based on the LLR of each information bit in the $i^{th}$ group of to-be-decoded bits.

Optionally, a path metric value of a decoding path indicates a probability that the decoding path is a real decoding path.

Optionally, a path metric value of a decoding path may be calculated according to Formula 1 below:

$$PM_{ml} = \Sigma_{j=0}^{m} 1 + e^{-(1-2\hat{u}_{jl})\alpha_{jl}} \qquad \text{Formula 1}$$

In the preceding formula, l represents an index of a decoding path, m is a quantity of bits included in a current path, $\hat{u}_{jl}$ is a decoding result (0 or 1) obtained by decoding a $j^{th}$ bit in the decoding path l, and $\alpha_{jl}$ is an LLR of the $j^{th}$ bit in the decoding path l.

In Formula 1, a smaller path metric value of a decoding path indicates a higher probability that the decoding path is a real decoding path.

Optionally, a path metric value of a decoding path may be calculated recursively according to Formula 2 below:

$$PM_{i_l} = \begin{cases} PM_{i-1_l}, & \hat{u}_{i_l} = \frac{1}{2}(1 - \text{sgn}(\alpha_{i_l})) \\ PM_{i-1_l} + |\alpha_{i_l}|, & \text{otherwise} \end{cases}$$

$$= \frac{1}{2} \sum_{j=0}^{i} \text{sgn}(\alpha_{j_l})\alpha_{j_l} - (1 - 2\hat{u}_{i_l})\alpha_{j_l} \qquad \text{Formula 2}$$

It is assumed that a to-be-encoded sequence corresponding to a current node is u0, u1, ..., and ux, and an encoded sequence is c0, c1, ..., and cx. In Formula 2, $\hat{u}_{i_l}$ is a result obtained after a sequence of a decoding path l is encoded in the node, i represents an $i^{th}$ bit ci (0 or 1) in the sequence, and $PM_{i_l}$ represents a path metric value of an $i^{th}$ decoding node on the decoding path l, $\alpha_{i_l}$ is an LLR of an $i^{th}$ bit in an LLR sequence corresponding to the sequence of the decoding path l, and $\alpha_{j_l}$ is an LLR of a $j^{th}$ bit in the decoding path l. When $\alpha_{i_l} > 0$, $\text{sgn}(\alpha_{i_l})$ is 1; or when $\alpha_{i_l} < 0$, $\text{sgn}(\alpha_{i_l})$ is −1. One node corresponds to one group of to-be-decoded bits.

In Formula 2, a smaller path metric value of a decoding path indicates a higher probability that the decoding path is a real decoding path.

It should be noted that the path metric value of the decoding path reflects measurement of a probability that the decoding path is a real decoding path. Path metric calculation may be performed in a plurality of manners, so that there are a plurality of path metric values. The foregoing two manners are merely examples. In the foregoing manners, a smaller path metric value indicates a higher probability that a corresponding decoding path is a real decoding path. In some manners, other types of path metric values defined in other manners may be used. Larger path metric values of these types indicate higher probabilities that a corresponding decoding path is a real decoding path.

For ease of description, in this application, an example in which a smaller metric value of a decoding path indicates a higher probability that the decoding path is a real decoding path is used for description. A person skilled in the art may understand that, if another type of path metric value is used, and a larger path metric value of this type indicates a higher probability that a decoding path is a real decoding path, an adaptive change is made to a technical solution related to the path metric value.

When i is greater than 1, all the possible decoding paths in the $i^{th}$-step decoding may be determined based on a decoding path obtained through $(i-1)^{th}$-step decoding and a quantity n of information bits included in the $i^{th}$ group of to-be-decoded bits.

Figure 2A:
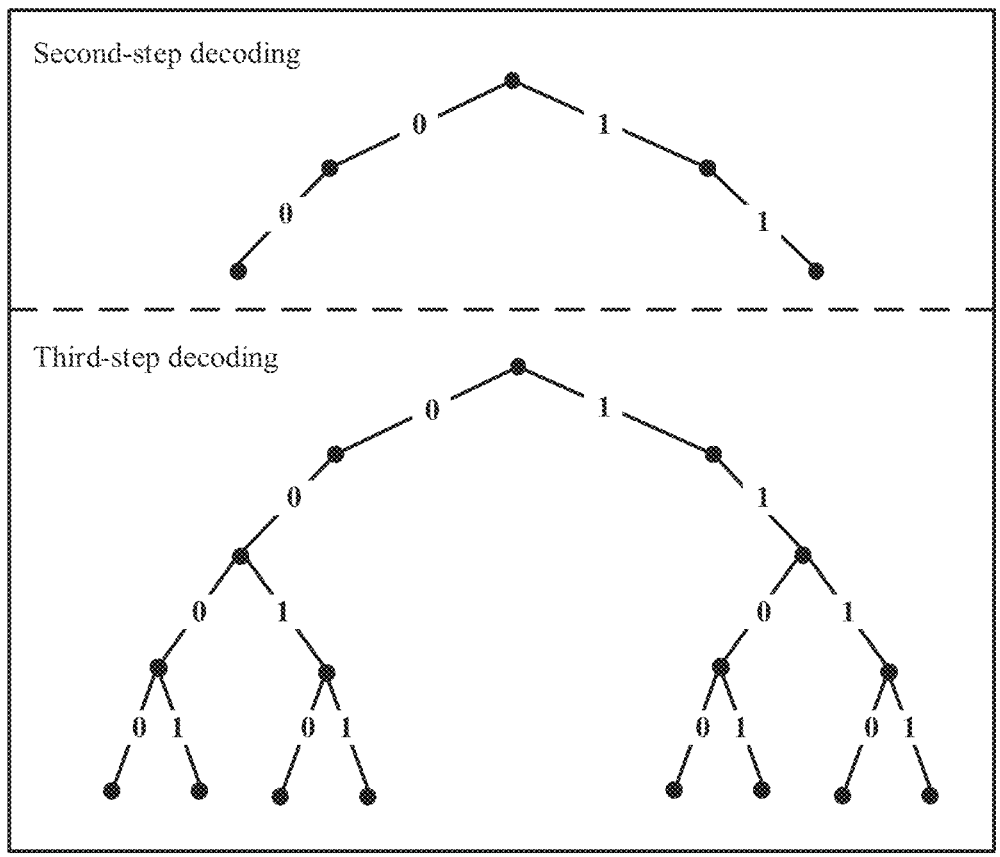
FIG. 2A is a schematic diagram of a decoding path according to this application.

With reference to FIG. 2A, the following describes in detail all the possible decoding paths in the $i^{th}$-step decoding.

FIG. 2A is a schematic diagram of a decoding path according to this application. Referring to FIG. 2A, it is assumed that there are two decoding paths: 00 and 11, obtained through second-step decoding.

During third-step decoding, assuming that the third group of to-be-decoded bits includes two information bits, all possible decoding paths in the third-step decoding include $2^2$ decoding paths (0000, 0001, 0010, and 0011) obtained by extending the path 00 and $2^2$ decoding paths (1100, 1101, 1110, and 1111) obtained by extending the path 11. In other words, all the possible decoding paths in the third-step decoding are $2*2^2$ decoding paths, including 0000, 0001, 0010, 0011, 1100, 1101, 1110, and 1111.

Step C: Select at least one reserved decoding path based on the path metric values of all the possible decoding paths.

Optionally, a quantity of reserved decoding paths is less than or equal to X, where X is a quantity that is of reserved paths and that corresponds to the SCL parallel decoding method.

Optionally, the quantity X of reserved paths may be 4, 8, 16, or the like, and may be set based on an actual requirement.

It should be noted that, if a quantity of all possible decoding paths is greater than or equal to X, the quantity of reserved decoding paths is equal to X; or if a quantity of all possible decoding paths is less than X, the quantity of reserved decoding paths is less than X and is equal to the quantity of all possible decoding paths.

Optionally, when i is greater than 1, a decoding result in the $(i-1)^{th}$-step decoding needs to be used in the $i^{th}$-step decoding.

For example, after first-step decoding, a plurality of reserved decoding paths in the first-step decoding may be obtained. The second-step decoding is performed based on the plurality of reserved decoding paths in the first-step decoding, to obtain a plurality of reserved decoding paths in the second-step decoding. The third-step decoding is performed based on the plurality of reserved decoding paths in the second-step decoding, to obtain a plurality of reserved decoding paths in the third-step decoding. The rest may be deduced by analogy, until P-step decoding is completed.

Optionally, when the $i^{th}$-step decoding is completed, reserved decoding paths obtained through the $i^{th}$-step decoding are decoding paths corresponding to the first to $i^{th}$ groups of to-be-decoded bits. The decoding paths may be possible values of the first to $i^{th}$ groups of to-be-decoded bits.

For example, it is assumed that a receive end receives 16 LLRs. Correspondingly, the quantity of to-be-decoded bits is 16, and the 16 to-be-decoded bits are respectively denoted as u0, u1, . . . , and u15. It is assumed that all the 16 to-be-decoded bits are to-be-decoded information bits. It is assumed that the 16 to-be-decoded bits are divided into four groups, each group of to-be-decoded bits includes four to-be-decoded bits, and to-be-decoded bits included in the four groups of to-be-decoded bits are listed in Table 1.

TABLE 1

| | |
|---|---|
| First group of to-be-decoded bits | u0, u1, u2, and u3 |
| Second group of to-be-decoded bits | U4, u5, u6, and u7 |
| Third group of to-be-decoded bits | U8, u9, u10, and u11 |
| Fourth group of to-be-decoded bits | U12, u13, u14, and u15 |

After the first-step decoding is completed, the reserved decoding paths obtained through the first-step decoding are decoding paths corresponding to the first group of to-be-decoded bits u0 to u3. A length of the plurality of decoding paths in the first-step decoding is 4. For example, the plurality of reserved decoding paths in the first-step decoding may be 0000, 0001, 0010, and 0011.

After the second-step decoding is completed, the reserved decoding paths obtained through the second-step decoding are decoding paths corresponding to the first and second groups of to-be-decoded bits u0 to u7. A length of the plurality of decoding paths in the second-step decoding is 8. For example, the plurality of reserved decoding paths in the second-step decoding may be 00000000, 00000001, and 00000010.

After the third-step decoding is completed, the reserved decoding paths obtained through the third-step decoding are decoding paths corresponding to the first to third groups of to-be-decoded bits u0 to u11. A length of the plurality of decoding paths in the third-step decoding is 12. For example, the plurality of reserved decoding paths in the third-step decoding may be 000000000000, 000000000001, and 000000000010.

After fourth-step decoding is completed, reserved decoding paths obtained through the fourth-step decoding are decoding paths corresponding to the first to fourth groups of to-be-decoded bits u0 to u15. A length of the plurality of decoding paths in the fourth-step decoding is 16. For example, the plurality of reserved decoding paths in the fourth-step decoding may be 0000000000000000 and 0000000000000001.

Therefore, one decoding path may be selected from the plurality of reserved decoding paths obtained through the fourth-step decoding as the decoding result. For example, the foregoing description is used as an example, and the selected decoding path is 0000000000000001. In other words, the decoding result of the 16 bits u0 to u15 is 0000000000000001.

The following separately describes in detail a process of the first-step decoding and a process of the $i^{th}$-step decoding ($2 \leq i \leq P$). For details, refer to embodiments shown in FIG. 3 and FIG. 4.

Figure 3:
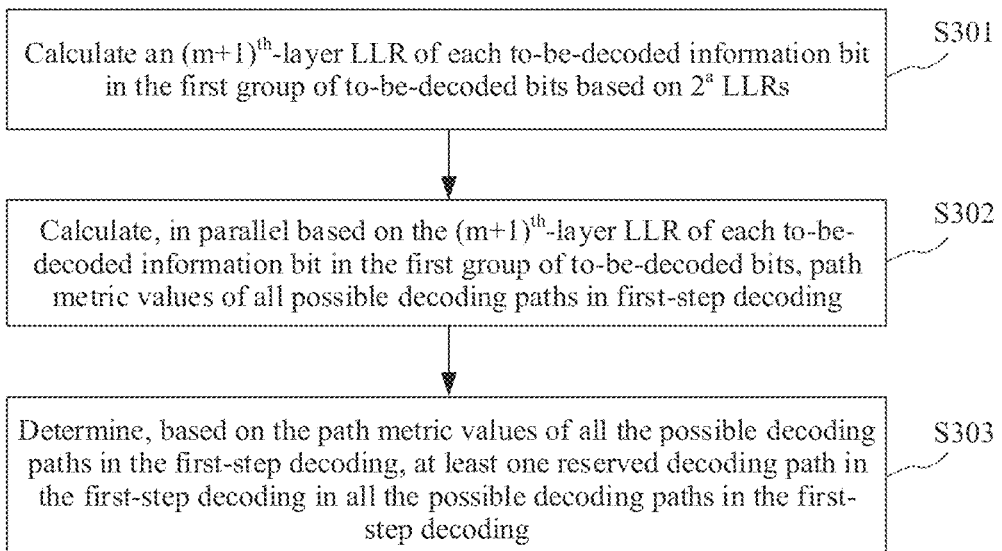
FIG. 3 is a schematic flowchart of another SCL parallel decoding method according to this application.

FIG. 3 is a schematic flowchart of another SCL parallel decoding method according to this application. The embodiment shown in FIG. 3 is a process of first-step decoding of SCL parallel decoding. Referring to FIG. 3, the method may include the following steps.

S301: Calculate an $(m+)^{th}$-layer LLR of each to-be-decoded information bit in the first group of to-be-decoded bits based on $2^a$ LLRs.

S302: Calculate, in parallel based on the $(m+1)^{th}$-layer LLR of each to-be-decoded information bit in the first group of to-be-decoded bits, path metric values of all possible decoding paths in the first-step decoding.

Optionally, an LLR of each information bit in the first group of to-be-decoded bits may be calculated in parallel by using an ML algorithm or a simplified SC algorithm, and then the path metric values of all the possible decoding paths in the first-step decoding are calculated in parallel based on the LLR of each information bit in the first group of to-be-decoded bits.

For example, assuming that the first group of to-be-decoded bits includes two information bits, all the possible decoding paths in the first-step decoding include $2^2$ decoding paths: 00, 01, 10, and 11.

For example, assuming that the first group of to-be-decoded bits includes four information bits, all the possible decoding paths in the first-step decoding include $2^4$ decoding paths: 0000, 0001, 0010, 001, 0100, 0101, 0110, 0111, 1000, 1001, 1010, 1011, 1100, 1101, 1110, and 1111.

S303: Determine, based on the path metric values of all the possible decoding paths in the first-step decoding, at least one reserved decoding path of the first group of to-be-decoded bits in all the possible decoding paths in the first-step decoding.

Optionally, the reserved decoding path of the first group of to-be-decoded bits may also be referred to as a first decoding path of the first group of to-be-decoded bits, or may be referred to as a reserved decoding path in the first-step decoding or a first decoding path in the first-step decoding.

Optionally, a quantity of reserved decoding paths in the first-step decoding is less than or equal to X, where X is a quantity that is of reserved paths and that corresponds to the SCL parallel decoding method.

Optionally, the quantity X of reserved paths may be 4, 8, 16, or the like, and may be set based on an actual requirement.

It should be noted that, if a quantity of all possible decoding paths in the first-step decoding is greater than or equal to X, X reserved decoding paths may be selected from all the possible decoding paths in the first-step decoding. In this case, the quantity of reserved decoding paths in the first-step decoding is equal to X. If a quantity of all possible decoding paths in the first-step decoding is less than X, all the possible decoding paths in the first-step decoding are determined as the reserved decoding paths in the first-step decoding. In this case, the quantity of reserved decoding paths obtained through the first-step decoding is less than X.

Optionally, a smaller path metric value of a decoding path indicates a higher probability that the decoding path is a real decoding path. In this case, if the quantity of all possible decoding paths in the first-step decoding is greater than X, the X reserved decoding paths may be selected in the following feasible implementation: determining, in all the possible decoding paths in the first-step decoding, X decoding paths having smallest path metric values as the X reserved decoding paths.

Figure 4:
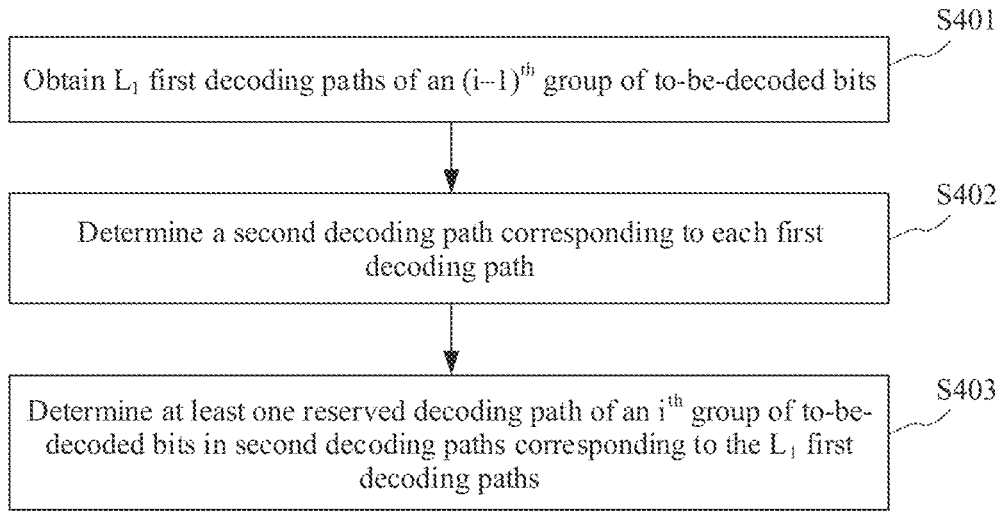
FIG. 4 is a schematic flowchart of still another SCL parallel decoding method according to this application.

FIG. 4 is a schematic flowchart of still another SCL parallel decoding method according to this application. The embodiment shown in FIG. 4 is a process of any $i^{th}$-step decoding ($1 \leq i \leq P$) of SCL parallel decoding. Referring to FIG. 4, the method may include the following steps.

S401: Obtain $L_1$ first decoding paths of an $(i-1)^{th}$ group of to-be-decoded bits, where data is received before S401, the received data corresponds to P groups of to-be-decoded bits, i is an integer, P is an integer greater than 1, $1<i \leq P$, and $L_1$ is a positive integer.

Optionally, $L_1 \leq X$.

For example, when X is 8, $L_1$ may be 2, 4, or 8.

It should be noted the $L_1$ first decoding paths of the $(i-1)^{th}$ group of to-be-decoded bits are reserved decoding paths of the $(i-1)^{th}$ group of to-be-decoded bits.

It should be noted that, in the SCL parallel decoding method, decoding needs to be performed step by step. To be specific, first-step decoding is performed, to obtain a first decoding path (reserved decoding path) in the first-step decoding; then second-step decoding is performed based on the first decoding path in the first-step decoding, to obtain a first decoding path in the second-step decoding; then third-step decoding is performed based on the first decoding path in the second-step decoding, to obtain a first decoding path in the third-step decoding; and so on. Therefore, when $i^{th}$-step decoding is performed, $L_1$ first decoding paths in $(i-1)^{th}$-step decoding have been obtained.

Optionally, after the $L_1$ first decoding paths in the $(i-1)^{th}$-step decoding are obtained, the $L_1$ first decoding paths may be buffered. Correspondingly, during the $i^{th}$-step decoding, the $L_1$ first decoding paths may be directly obtained from the buffer.

It should be noted that, only when $L_1 \times 2^n$ is greater than a first preset threshold, the $i^{th}$-step decoding is performed by using the method shown in the embodiment in FIG. 4. When $L_1 \times 2^n$ is less than or equal to the first preset threshold, the $i^{th}$-step decoding may be performed by using a method in a current technology.

S402. Determine a second decoding path corresponding to each first decoding path.

A quantity of second decoding paths corresponding to each first decoding path is less than $2^n$, where n is a quantity of information bits included in an $i^{th}$ group of to-be-decoded bits.

Optionally, for any first decoding path, a quantity of second decoding paths corresponding to the first decoding path may be determined, and then a second decoding path corresponding to the first decoding path is determined based on the quantity of second decoding paths corresponding to the first decoding path.

In the $L_1$ first decoding paths, a quantity of second decoding paths corresponding to at least one first decoding path is different from a quantity of second decoding paths corresponding to another first decoding path. That is, quantities of second decoding paths corresponding to the $L_1$ first decoding paths are not exactly the same.

Optionally, the quantity of second decoding paths corresponding to the first decoding path may be determined based on a path metric value of the first decoding path.

Optionally, when a path metric value of an $x^{th}$ first decoding path is greater than or equal to a path metric value of a $y^{th}$ first decoding path, a quantity of second decoding paths corresponding to the $x^{th}$ first decoding path is less than or equal to a quantity of second decoding paths corresponding to the $y^{th}$ first decoding path, where x is a positive integer, $1 \leq x \leq L_1$, y is a positive integer, and $1 \leq y \leq L_1$. That is, a smaller path metric value of a first decoding path indicates a larger quantity of second decoding paths corresponding to the first decoding path.

When a path metric value of a first decoding path is smaller, a higher probability that the first decoding path is a real decoding path is ensured. Correspondingly, a higher probability that a second decoding path corresponding to the first decoding path is a real decoding path is also ensured. Therefore, a relatively high probability that a second decoding path determined in the foregoing manner is a real decoding path is ensured.

Optionally, $L_1=32$, $n=4$, and in the 32 first decoding paths, a quantity of second decoding paths corresponding to each of four first decoding paths is 4, a quantity of second decoding paths corresponding to each of 20 first decoding paths is 2, and a quantity of second decoding paths corresponding to each of eight first decoding paths is 1.

For example, in the 32 first decoding paths sorted in ascending order of path metric values, a quantity of second decoding paths corresponding to each of the first to fourth first decoding paths is 4, a quantity of second decoding paths corresponding to each of the fifth to $24^{th}$ first decoding paths is 2, and a quantity of second decoding paths corresponding to each of the $25^{th}$ to $32^{nd}$ first decoding paths is 1.

Optionally, $L_1=32$, $n=4$, and in the 32 first decoding paths, a quantity of second decoding paths corresponding to each of eight first decoding paths is 4, a quantity of second decoding paths corresponding to each of eight first decoding paths is 2, and a quantity of second decoding paths corresponding to each of 16 first decoding paths is 1.

For example, in the 32 first decoding paths sorted in ascending order of path metric values, a quantity of second decoding paths corresponding to each of the first to eighth first decoding paths is 4, a quantity of second decoding paths corresponding to each of the ninth to $16^{th}$ first decoding paths is 2, and a quantity of second decoding paths corresponding to each of the $17^{th}$ to $32^{nd}$ first decoding paths is 1.

Optionally, for any first decoding path, after a quantity of second decoding paths corresponding to the first decoding path is determined, a second decoding path corresponding to the first decoding path may be determined in the following feasible implementations.

First feasible implementation:

$2^n$ branch paths corresponding to the $i^{th}$ group of to-be-decoded bits are determined based on the quantity n of information bits included in the $i^{th}$ group of to-be-decoded bits. A branch metric value of each branch path is obtained. The second decoding path corresponding to the first decoding path is determined based on the path metric value of the first decoding path and the branch metric value of each branch path.

Optionally, a branch metric value of a branch path is used to indicate a probability that the branch path is a real decoding path.

Optionally, a branch metric value of a branch path may be determined according to Formula 3 below:

$$BM_j = \sum_{i=0}^{s} |\beta_j[i] - h(\alpha[i])| \cdot |\alpha[i]|,$$

Formula 3 where $\beta_j[i]$ is an $i^{th}$ element in an intermediate sequence corresponding to a $j^{th}$ branch path, a to-be-decoded sequence may be obtained by performing recoding on the intermediate sequence by using an encoding matrix of a polar code, $\alpha[i]$ represents an $i^{th}$ input LLR of a current node, and h( ) represents a hard decision result of the input LLR.

Optionally, a smaller branch metric value of a branch path indicates a higher probability that the branch path is a real decoding path.

It should be noted that, when a branch metric value of another type of branch path is determined in another manner, it is also possible that a larger branch metric value of the branch path of this type indicates a higher probability that the branch path is a real decoding path.

It should be noted that, in this application, an example in which a smaller branch metric value of a branch path indicates a higher probability that the branch path is a real decoding path is used for description. Certainly, when a larger branch metric value of a branch path indicates a higher probability that the branch path is a real decoding path, an adaptive change is made to a technical solution related to the branch metric value.

For example, assuming that n is 1, $2^1$ branch paths are 1 and 0.

For example, assuming that n is 2, $2^2$ branch paths are 00, 01, 10, and 11.

For example, assuming that n is 3, $2^3$ branch paths are 000, 001, 010, 011, 100, 101, 110, and 111.

Optionally, assuming that the quantity of second decoding paths corresponding to the first decoding path is K, K branch paths having smallest branch metric values may be selected from the $2^n$ branch paths, and the K second decoding paths corresponding to the first decoding path are determined based on the K branch paths and the first decoding path.

Optionally, the K branch paths and the first decoding path may be separately combined, to obtain the K second decoding paths.

For example, assuming that the first decoding path is 00010001 and the $i^{th}$ group of to-be-decoded bits includes n=3 information bits, $2^3$ branch paths of an $i^{th}$ group of to-be-decoded paths are 000, 001, 010, 011, 100, 101, 110, and 111. Assuming that K is 4 and four branch paths having smallest branch metric values in the eight branch paths are 010, 011, 100, and 101, it may be determined that the second decoding paths corresponding to the first decoding path are 00010001010, 00010001011, 00010001100, and 00010001101.

Second feasible implementation:

Assuming that the quantity of second decoding paths corresponding to the first decoding path is K, $2^n$ third decoding paths corresponding to the first decoding path are determined, and K decoding paths having smallest path metric values in the $2^n$ third decoding paths are determined as the second decoding paths.

For example, assuming that the first decoding path is 00010001 and the $i^{th}$ group of to-be-decoded bits includes n=3 information bits, $2^3$ third decoding paths corresponding to the first decoding path are 00010001000, 00010001001, 00010001010, 00010001011, 00010001100, 00010001101, 00010001110, and 00010001111. Assuming that K is 4, path metric values of the eight third decoding paths are calculated, and four decoding paths having smallest path metric values are determined as the second decoding paths corresponding to the first decoding path.

Third feasible implementation:

The second decoding path corresponding to the first decoding path is determined based on an LLR array, of the first decoding path, input in the $i^{th}$-step decoding, a location of a non information bit included in the $i^{th}$ group of to-be-decoded bits, and a value of the non information bit.

Optionally, the second decoding path corresponding to the first decoding path may be determined based on the LLR array, of the first decoding path, input in the $i^{th}$ step decoding, the location of the non information bit included in the $i^{th}$ group of to-be-decoded bits, the value of the non information bit, and a preset correspondence.

Optionally, the preset correspondence includes a correspondence between the location of the non information bit, a lighted array, a symbolic parameter, and a mode.

Optionally, the LLR array input in the $i^{th}$-step decoding is an $(m+1)^{th}$-layer LLR, of each to-be-decoded information bit in the $i^{th}$ group of to-be-decoded bits, calculated based on the obtained $2^a$ LLRs, where the $2^a$ LLRs are obtained by demodulating the received information, and m is a quantity of bits included in each group of to-be-decoded bits.

Optionally, a value of the non information bit may be 0 or 1.

Optionally, the value of the non information bit may be related to a coding scheme and a to-be-coded information bit. For example, the coding scheme is a parity check polar code (PC-Polar). In this case, if a check result of a to-be-encoded bit corresponding to the non information bit is 0, the value of the non information bit is 0; or when a check result of a to-be-encoded bit corresponding to the non information bit is 1, the value of the non information bit is 1.

Figure 6:
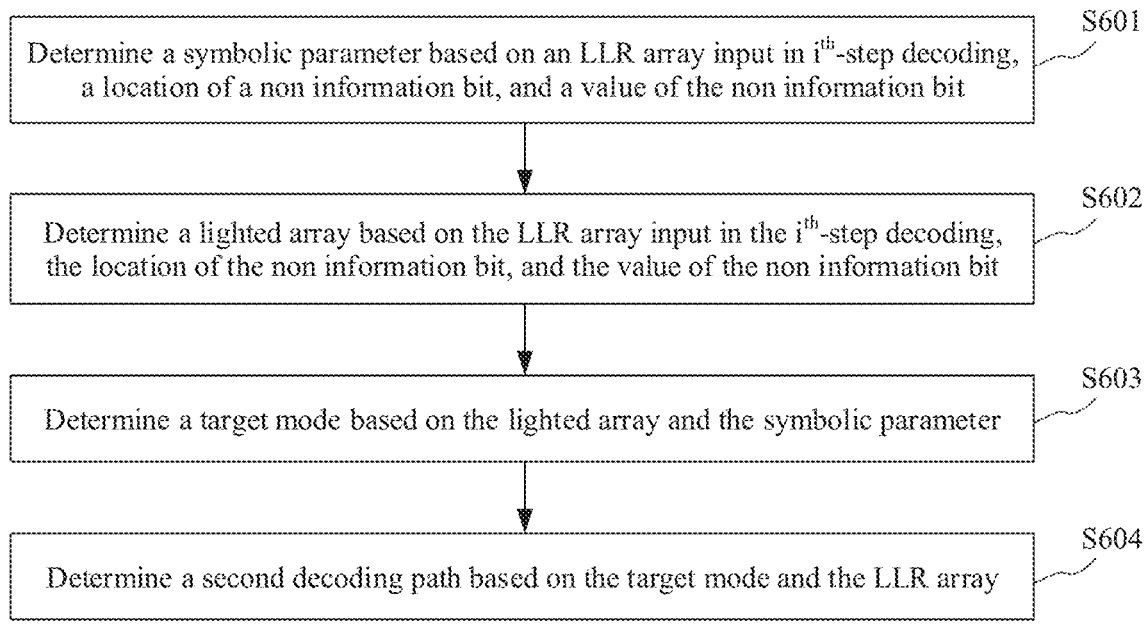
FIG. 6 is a schematic flowchart of a method for determining a second decoding path according to this application.

It should be noted that the feasible implementation is described in detail in an embodiment shown in FIG. 6. Details are not described herein again.

S403. Determine at least one reserved decoding path of the $i^{th}$ group of to-be-decoded bits in second decoding paths corresponding to the $L_1$ first decoding paths, where the at least one reserved decoding path includes a decoding result of the $i^{th}$ group of to-be-decoded bits.

Optionally, a quantity of the at least one reserved decoding path is less than or equal to X, where X is a quantity that is of reserved decoding paths and that corresponds to successive cancellation list SCL decoding, and X is a positive integer.

For example, X may be 4, 8, or 6.

Certainly, in an actual application process. X may be set based on an actual requirement.

Optionally, the path metric values of the second decoding paths corresponding to the $L_1$ first decoding paths may be determined, and the at least one reserved decoding path of the $i^{th}$ group of to-be-decoded bits is determined based on the path metric values of the second decoding paths corresponding to the $L_1$ first decoding paths.

Optionally, when the quantity of second decoding paths corresponding to the $L_1$ first decoding paths is greater than X, X second decoding paths having smallest path metric values in the second decoding paths corresponding to the $L_1$ first decoding paths may be determined as the at least one reserved decoding path of the $i^{th}$ group of to-be-decoded bits.

Optionally, when the quantity of second decoding paths corresponding to the $L_1$ first decoding paths is less than or equal to X, all the second decoding paths corresponding to the $L_1$ first decoding paths may be determined as the at least one reserved decoding path of the $i^{th}$ group of to-be-decoded bits.

The following describes sorting complexity in this application by using an example in which the second decoding path corresponding to the first decoding path is determined in the second feasible implementation in S402.

In S402, $L_2$ ($L_2=2^n$) third decoding paths need to be sorted for $L_1$ times, and the second decoding path is selected. It is assumed that a maximum quantity of second decoding paths corresponding to the first decoding path is $L_3$. Therefore, when a sorting method in which time complexity is $O(n^2)$ is used for sorting, sorting complexity in S402 is less than $L_1 \times L_2 \times L_3$.

In S403, $L_1 \times L_3$ second decoding paths need to be sorted once, and the reserved decoding path is selected. In most decoding steps, X reserved decoding paths are usually selected. Therefore, when the sorting method in which time complexity is $O(n^2)$ is used for sorting, sorting complexity in S404 is $L_1 \times L_3 \times X$.

In conclusion, sorting complexity of the $i^{th}$-step decoding ($2 \leq i \leq P$) in this application is $L_1 \times L_2 \times L_3 + L_1 \times L_3 \times X$.

Sorting complexity of the $i^{th}$-step decoding ($2 \leq i \leq P$) in the current technology is usually $L_1 \times L_2 \times X$.

The sorting complexity in the current technology is usually higher than the sorting complexity in this application. Details are described as follows:

Because $L_1$ is usually equal to X, $L_2=2^n$, $L_3=2^{m-k}$, and m is usually equal to n, it can be learned that:

the sorting complexity in this application is $X \times 2^n \times 2^{n-k} + X \times 2^{n-k} \times X$; and the sorting complexity in the current technology is $X \times 2^n \times X$, where $X \times 2^n \times X - X \times 2^n \times 2^{n-k} - X \times 2^{n-k} \times X = X \times 2^{n-k} \times [X \times (2^k - 1) - 2^n]$.

In an actual application process, a value of k is properly set, so that $X \times (2^k - 1) > 2^n$. In this way, the sorting complexity in this application is lower than the sorting complexity in the current technology.

For example, it may be determined that $k=n-2$, and it is assumed that $X=2^a$. In this case, $2^a \times (2^{n-2} - 1) > 2^n$ provided that $a > 2$, so that the sorting complexity in this application is lower than the sorting complexity in the current technology.

Figure 5:
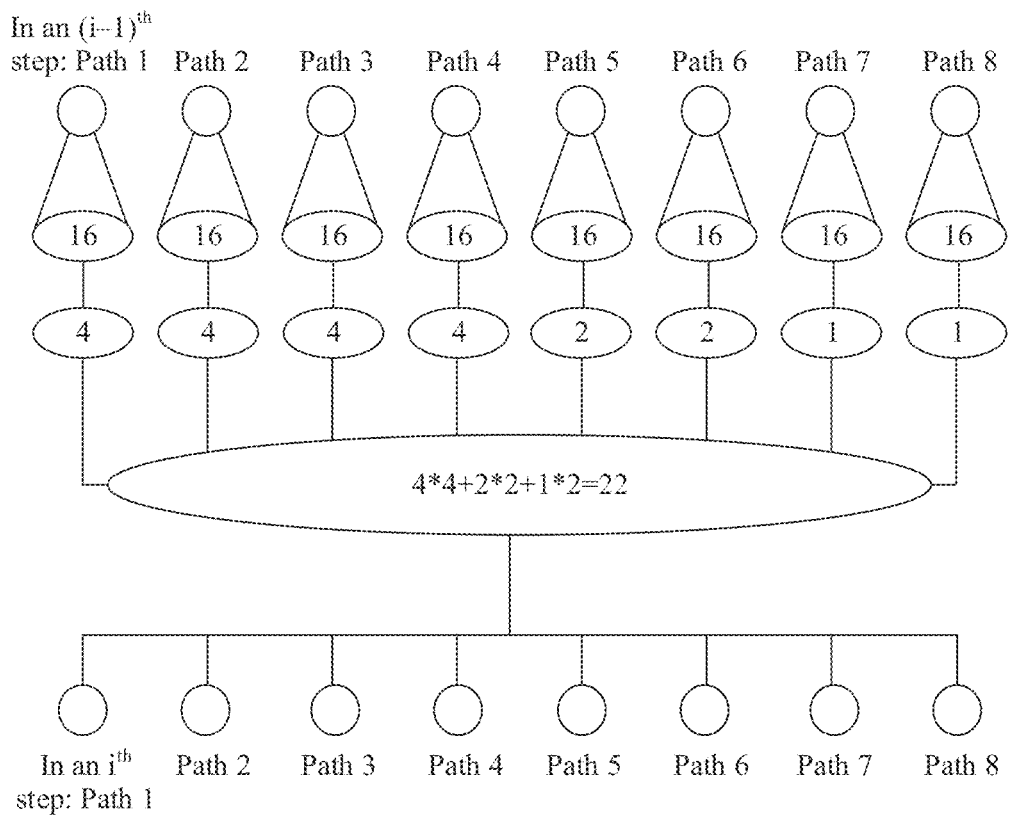
FIG. 5 is a schematic diagram of an SCL parallel decoding process according to this application.

With reference to FIG. 5, the following describes, by using a specific example, the decoding process in the embodiment shown in FIG. 4.

FIG. 5 is a schematic diagram of an SCL parallel decoding process according to this application. Referring to FIG. 5, it is assumed that eight decoding paths are obtained in an $(i-1)^n$ step, and the eight decoding paths are respectively denoted as a path 1, a path 2, . . . , and a path 8 in the $(i-1)^{th}$ step. Assuming that an $i^{th}$ group of to-be-decoded bits includes four to-be-decoded bits, in $i^{th}$-step decoding, for each decoding path in $(i-1)^{th}$-step decoding, 16 decoding paths may be obtained through extension. It is assumed that each of the determined path 1 to path 4 corresponds to four second decoding paths, each of the determined path 5 and path 6 corresponds to two second decoding paths, and each of the determined path 7 and path 8 corresponds to one second decoding path. In this case, four decoding paths may be selected from 16 decoding paths obtained by extending each of the path 1 to the path 4, two decoding paths may be selected from 16 decoding paths obtained by extending each of the path 5 and the path 6, and one decoding path may be selected from 16 decoding paths obtained by extending each of the path 7 and the path 8, so that 4*4+2*2+1*2=22 decoding paths can be obtained. Then, the 22 decoding paths are sorted, and eight decoding paths in the $i^t$h-step decoding are selected from the sorted 22 decoding paths. In the foregoing process, assuming that a sorting method in which time complexity is $O(n^2)$ is used for sorting, sorting complexity is: 16*4*4+16*2*2+16*1*2+22*8=528.

Compared with the current technology, in the current technology, in the $i^{th}$-step decoding, for each decoding path in the $(i-1)^{th}$-step decoding, 16 decoding paths may be obtained through extension, so that a total of 16*8=128 decoding paths can be obtained through extension. Then, the 128 decoding paths are sorted based on path metric values of the decoding paths, and eight decoding paths in the $i^{th}$-step decoding are selected from the sorted 128 decoding paths. In this case, sorting complexity is: 128*8=1024.

It can be learned from the foregoing that, compared with the current technology, in this application, the sorting complexity can be greatly reduced, thereby improving decoding efficiency.

According to the SCL parallel decoding method provided in this application, in any $i^{th}$-step decoding (i≥2) of SCL parallel decoding, the $L_1$ first decoding paths of the $(i-1)^{th}$ group of to-be-decoded bits are first obtained, the second decoding path corresponding to each first decoding path is determined, and at least one reserved path is determined in the second decoding paths corresponding to the $L_1$ first decoding paths. Because the quantity of second decoding paths corresponding to the first decoding path is less than $2^n$, the sorting complexity can be reduced by using the foregoing method, thereby improving efficiency of the SCL parallel decoding method.

Based on the embodiments shown in FIG. 4 and FIG. 5, for any one of the $L_1$ first decoding paths, the following describes, by using an embodiment shown in FIG. 6, in detail the third feasible implementation of determining the second decoding path in S402.

FIG. 6 is a schematic flowchart of a method for determining a second decoding path according to this application. Referring to FIG. 6, the method may include the following steps.

S601: Determine a symbolic parameter based on an LLR array input in $i^{th}$-step decoding, a location of a non information bit, and a value of the non information bit.

Optionally, the symbolic parameter may be determined by performing the following step A to step C.

Step A: Determine a check expression array based on the LLR array.

The LLR array includes m elements, and the check expression array includes m elements.

Optionally, a hard decision value of each element in the LLR array may be determined, and a hard decision value, of each element in the LLR array, included in the check expression array is determined.

Optionally, if an element in the LLR array is greater than 0, a hard decision value corresponding to the element is 0; or if an element in the LLR array is less than 0, a hard decision value corresponding to the element is 1.

For example, assuming that the LLR array is {7, −3, −6, 1}, m=4 hard decision values corresponding to the LLR array are respectively 0, 1, 1, and 0, so that it is determined that the check expression array is C={0, 1, 1, 0}.

Step B: Determine, in check expression array based on the location of the non information bit, a target check expression that participates in calculation of the symbolic parameter.

Optionally, a first correspondence between the location of the non information bit and the check expression that participates in calculation of the symbolic parameter may be preset.

For example, when a group of to-be-decoded bits includes four bits, and the group of to-be-decoded bits includes one non information bit, the first correspondence may be listed in Table 2.

TABLE 2

| Location of a non information bit | Check expression |
| --- | --- |
| 0 | C0 + C1 + C2 + C3 |
| 1 | C1 + C3 |

TABLE 2-continued

| Location of a non information bit | Check expression |
| --- | --- |
| 2 | C2 + C3 |
| 3 | C3 |

It should be noted that, Table 2 is merely an example of the first correspondence, but is not a limitation on the first correspondence.

Step C: Determine the symbolic parameter based on a value of the non information bit and the target check expression that participates in calculation of the symbolic parameter.

Optionally, assuming that the symbolic parameter is S, S=sign⊕$u_{PC}$, where sign is the target check expression that participates in calculation of the symbolic parameter, and $u_{PC}$ is the value of the non information bit.

For example, assuming that check expressions that participate in calculation are 1 and 0 and the value of the non information bit is 1, S=1⊕0⊕1=0.

S602: Determine a lighted array based on the LLR array input in the $i^{th}$-step decoding, the location of the non information bit, and the value of the non information bit.

Optionally, the lighted array may be determined in the following feasible implementation. A first array is determined based on the location of the non information bit, where the first array includes m elements, and a value of each element is 0 or 1. The elements in the first array are sorted based on absolute values of LLRs in the LLR array, to obtain the lighted array.

Optionally, the first array may be determined based on the location of the non information bit and the first correspondence.

For example, assuming that the first correspondence is listed in Table 2 and the location of the non information bit is 1, it may be determined that check expressions C1 and C3 participate in calculation of the symbolic parameter, so that the first array f={0, 1, 0, 1} is determined.

It should be noted that a correspondence between the location of the non information bit and the first array may be further preset. For example, when a group of to-be-decoded bits includes four bits, and the group of to-be-decoded bits includes one non information bit, the correspondence between the location of the non information bit and the first array may be listed in Table 3.

TABLE 3

| Location of a non information bit | First array |
| --- | --- |
| 0 | {1, 1, 1, 1} |
| 1 | {0, 1, 0, 1} |
| 2 | {0, 0, 1, 1} |
| 3 | {0, 0, 0, 1} |

For example, assuming that the LLR array is {7, −3, −6, 1}, the absolute values of the elements in the LLR array are sorted to obtain |LLR$_3$|<|LLR$_1$|<|LLR$_2$|<|LLR$_0$|. The first array f={0, 1, 0, 1} is sorted based on |LLR$_3$|<|LLR$_1$|<|LLR$_2$|<|LLR$_0$|, to obtain the lighted array $f_\pi$=($f_3$, $f_1$, $f_2$, $f_0$={1,1,0,0}.

Optionally, when a group of to-be-decoded bits includes four to-be-decoded bits, a correspondence between a quantity of non information bits, a location of the non information bit and a lighted array may include at least one of the following relationships:

when the quantity of non information bits is 1 and the non information bit occupies the first location, the lighted array includes 1111:

when the quantity of non information bits is 1 and the non information bit occupies the second location, the lighted array includes 1100, 1010, 1001, 0110, 0101, and 0011;

when the quantity of non information bits is 1 and the non information bit occupies the third location, the lighted array includes 1100, 1010, 1001, 0110, 0101, and 0011; or when the quantity of non information bits is 1 and the non information bit occupies the fourth location, the lighted array includes 1000, 0100, 0010, and 0001.

S603: Determine a target mode based on the lighted array and the symbolic parameter.

Optionally, at least one mode corresponding to the lighted array and the symbolic parameter may be first determined, and the target mode is determined in the at least one mode.

Optionally, a third correspondence between the lighted array, the symbolic parameter, and the at least one mode may be preset. Correspondingly, the at least one mode may be determined based on the lighted array, the symbolic parameter, and the third correspondence.

Optionally, the target mode may be determined in the at least one mode based on a branch metric value of the at least one mode.

Optionally, the branch metric value of the mode may be determined based on the LLR array and the mode.

Optionally, the branch metric value of the mode is a sum of elements in an LLR array corresponding to an element 1 in the mode.

For example, assuming that the LLR array is {7, −3, −6, 1} and a mode is 0000, because there is no element 1 in the mode, a branch metric value corresponding to the mode is 0.

For example, assuming that the LLR array is {7, −3, −6, 1} and a mode is 0010, a branch metric value corresponding to the mode is a value of the third element in the LLR array, that is, a branch metric value corresponding to the mode is −6.

For example, assuming that the LLR array is {7, −3, −6, 1} and a mode is 1100, a branch metric value corresponding to the mode is a sum of the first element and the second element in the LLR array, that is, a branch metric value corresponding to the mode is 7−3=4.

Optionally, assuming that a first path corresponds to K second paths. K modes having smallest branch metric values in the at least one mode are determined as target modes.

Optionally, when a group of to-be-decoded bits includes four to-be-decoded bits, the third correspondence between the lighted array, the symbolic parameter (S), and the at least one mode may be shown as follows:

when the lighted array is 1111 and S is 0, the at least one mode includes 0000, 1100, 1010, 1001, and 0110:

when the lighted array is 1111 and S is 1, the at least one mode includes 1000, 0100, 0010, 0001, and 1110;

when the lighted array is 1100 and S is 0, the at least one mode includes 0000, 0010, 1100, 0001, and 1110;

when the lighted array is 1100 and S is 1, the at least one mode includes 1000, 1010, 0100, 1001, and 0110;

when the lighted array is 1010 and S is 0, the at least one mode includes 0000, 0100, 0001, and 1010;

when the lighted array is 1010 and S is 1, the at least one mode includes 1000, 1100, 0010, 1001, and 0110;

when the lighted array is 1001 and S is 0, the at least one mode includes 0000, 0100, 0010, 0110, and 1001;

when the lighted array is 1001 and S is 1, the at least one mode includes 1000, 1100, 1010, 1110, and 0001;

when the lighted array is 0110 and S is 0, the at least one mode includes 0000, 1000, 0001, 1001, 0110, and 1110;

when the lighted array is 0110 and S is 1, the at least one mode includes 0100, 1100, 0010, and 1010;

when the lighted array is 0101 and S is 0, the at least one mode includes 0000, 1000, 0010, and 1010;

when the lighted array is 0101 and S is 1, the at least one mode includes 0100, 1100, 0110, 1110, 0001, and 1001;

when the lighted array is 0011 and S is 0, the at least one mode includes 0000, 1000, 0100, and 1100;

when the lighted array is 0011 and S is 1, the at least one mode includes 0010, 1010, 0110, 1110, 0001, and 1001;

when the lighted array is 1000 and S is 0, the at least one mode includes 0000, 0100, 0010, 0110, and 0001;

when the lighted array is 1000 and S is 1, the at least one mode includes 1000, 1100, 1010, 1110, and 1001;

when the lighted array is 0100 and S is 0, the at least one mode includes 0000, 1000, 0010, 1010, and 0001;

when the lighted array is 0100 and S is 1, the at least one mode includes 0100, 1100, 0110, 1110, and 0101;

when the lighted array is 0010 and S is 0, the at least one mode includes 0000, 1000, 0100, 1100, and 0001;

when the lighted array is 0010 and S is 1, the at least one mode includes 0010, 1010, 0110, 1110, and 0011;

when the lighted array is 0001 and S is 0, the at least one mode includes 0000, 1000, 0100, 1100, and 0010; or when the lighted array is 0001 and S is 1, the at least one mode includes 0001, 1001, 0101, 1101, and 0011.

It should be noted that, when a group of to-be-decoded bits includes four to-be-decoded bits and a quantity of non information bits is 0, the at least one mode includes 0000, 1000, 0100, 0010, and 1100.

S604: Determine the second decoding path based on the target mode and the LLR array.

Optionally, the second decoding path may be determined based on the target mode, the lighted array, and the check expression array.

Optionally, a PSUM corresponding to the target mode may be determined based on the target mode, the lighted array, and the check expression array, the PSUM is decoded to obtain a branch path, and the second decoding path is determined based on a first decoding path and the branch path.

For example, it is assumed that the target mode is 0010, the lighted array is $f_\pi = \{f_3, f_1, f_2, f_0\} = \{1,1,0,0\}$, and the check expression array is $C = \{0, 1, 1, 0\}$. Because the third element in the target mode is 1, the third element in the target mode corresponds to $f_2$ in the lighted array. Correspondingly, an element (the third element) that corresponds to $f_2$ and that is in the check array is inverted to obtain 0100.

For example, it is assumed that the target mode is 1100, the lighted array is $f_\pi = \{f_3, f_1, f_2, f_0\} = (1,1,0,0)$, and the check expression array is $C = \{0, 1, 1, 0\}$. Because the first element and the second element in the target mode are 1, the first element and the second element in the target mode correspond to $f_3$ and $f_1$ in the lighted array. Correspondingly, an element (the second element) that corresponds to $f_1$ and that is in the check expression array and an element (the fourth element) that corresponds to $f_3$ and that is in the check expression array are inverted to obtain 0011.

The following describes, by using a specific example, in detail the method shown in the embodiment of FIG. 6.

When a group of to-be-decoded bits includes four to-be-decoded bits, a correspondence between a quantity of non information bits, a location of a non information bit, a lighted array, a symbolic parameter, and a mode may be listed in Table 4.

TABLE 4

| Quantity of non information bits | Location of a non info bit | Check expression | Lighted array | Symbolic parameter | Mode P0 | Mode P1 | Mode P2 | Mode P3 | Mode P4 | Mode P5 |
|---|---|---|---|---|---|---|---|---|---|---|
| 0 | * | * | * | * | 0000 | 1000 | 0100 | 0010 | 1100 | * |
| 1 | 0 | C0 + C1 + C2 + C3 | 1111 | 0 | 0000 | 1100 | 1010 | 1001 | 0110 | * |
|   |   |   |   | 1 | 1000 | 0100 | 0010 | 0001 | 1110 | * |
|   | 1 | C1 + C3 | 1100 | 0 | 0000 | 0010 | 1100 | 0001 | 1110 | * |
|   |   |   |   | 1 | 1000 | 1010 | 0100 | 1001 | 0110 | * |
|   |   |   | 1010 | 0 | 0000 | 0100 | 0001 | 1010 | * | * |
|   |   |   |   | 1 | 1000 | 1100 | 0010 | 1001 | 0110 | * |
|   |   |   | 1001 | 0 | 0000 | 0100 | 0010 | 0110 | 1001 | * |
|   |   |   |   | 1 | 1000 | 1100 | 1010 | 1110 | 0001 | * |
|   |   |   | 0110 | 0 | 0000 | 1000 | 0001 | 1001 | 0110 | 1110 |
|   |   |   |   | 1 | 0100 | 1100 | 0010 | 1010 | * | * |
|   |   |   | 0101 | 0 | 0000 | 1000 | 0010 | 1010 | * | * |
|   |   |   |   | 1 | 0100 | 1100 | 0110 | 1110 | 0001 | 1001 |
|   |   |   | 0011 | 0 | 0000 | 1000 | 0100 | 1100 | * | * |
|   |   |   |   | 1 | 0010 | 1010 | 0110 | 1110 | 0001 | 1001 |
|   | 2 |   | 1100 | 0 | 0000 | 0010 | 1100 | 0001 | 1110 | * |
|   |   |   |   | 1 | 1000 | 1010 | 0100 | 1001 | 0110 | * |
|   |   |   | 1010 | 0 | 0000 | 0100 | 0001 | 1010 | * | * |
|   |   |   |   | 1 | 1000 | 1100 | 0010 | 1001 | 0110 | * |
|   |   |   | 1001 | 0 | 0000 | 0100 | 0010 | 0110 | 1001 | * |
|   |   | C2 + C3 |   | 1 | 1000 | 1100 | 1010 | 1110 | 0001 | * |
|   |   |   | 0110 | 0 | 0000 | 1000 | 0001 | 1001 | 0110 | 1110 |
|   |   |   |   | 1 | 0100 | 1100 | 0010 | 1010 | * | * |
|   |   |   | 0101 | 0 | 0000 | 1000 | 0010 | 1010 | * | * |
|   |   |   |   | 1 | 0100 | 1100 | 0110 | 1110 | 0001 | 1001 |
|   |   |   | 0011 | 0 | 0000 | 1000 | 0100 | 1100 | * | * |
|   |   |   |   | 1 | 0010 | 1010 | 0110 | 1110 | 0001 | 1001 |
|   | 3 | C3 | 1000 | 0 | 0000 | 0100 | 0010 | 0110 | 0001 | * |
|   |   |   |   | 1 | 1000 | 1100 | 1010 | 1110 | 1001 | * |
|   |   |   | 0100 | 0 | 0000 | 1000 | 0010 | 1010 | 0001 | * |
|   |   |   |   | 1 | 0100 | 1100 | 0110 | 1110 | 0101 | * |
|   |   |   | 0010 | 0 | 0000 | 1000 | 0100 | 1100 | 0001 | * |
|   |   |   |   | 1 | 0010 | 1010 | 0110 | 1110 | 0011 | * |
|   |   |   | 0001 | 0 | 0000 | 1000 | 0100 | 1100 | 0010 | * |
|   |   |   |   | 1 | 0001 | 1001 | 0101 | 1101 | 0011 | * |

It should be noted that, Table 4 may be split to obtain a plurality of tables, or some content in Table 4 may be retained. In other words, a plurality of variants of Table 4 fall within the protection scope of this application.

It is further assumed that the LLR array input in the $i^{th}$-step decoding is $\{7, -3, -6, 1\}$, the $i^{th}$ group of to-be-decoded bits includes one non information bit, the non information bit is located at a location 1 in the $i^{th}$ group of to-be-decoded bits, and a value of the non information bit is 1.

A check expression array C=$\{0, 1, 1, 0\}$ may be determined based on the LLR array $\{7, -3, -6, 1\}$.

According to Table 4, it may be determined that check expressions corresponding to the location 1 are C1 and C3. Therefore, it may be determined that the check expressions that participate in the calculation of the symbolic parameter are C1=1 and C30, and it is determined that the symbolic parameter is 1⊕0 ⊕ 1=0.

According to Table 4, it may be determined that check expressions corresponding to the location 1 are C1 and C3. Therefore, the first array f=$\{0, 1, 0, 1\}$ may be determined.

The first array is sorted based on the absolute values of the LLR array $\{7, -3, -6, 1\}$, to obtain the lighted array $f_\pi=\{f_3, f_1, f_2, f_0\}$=(1,1,0,0).

Five modes may be obtained by querying Table 4 based on the symbolic parameter 0 and the lighted array $\{1,1,0,0\}$, where the five modes include P0=0000, P1=0010, P2=1100, P3=0001, and P4=1110, and branch metric values of the five modes are respectively 0, 6, 4, 7, and 10.

Assuming that the first path corresponds to four second paths, four modes having smallest branch metric values, namely, P0=0000, P1=0010, P2=1100, and P3=0001, are selected from the five modes as the target modes.

PSUMs corresponding to P0=0000, P1=0010, P2=1100, and P3=0001 are obtained, where the PSUMs are respectively 0110, 0100, 0011, and 1110. The four PSUMs are recoded to obtain four branch paths: 0110, 1100, 0101, and 1110.

Assuming that the first path is 0000, it may be determined that the second paths corresponding to the first path are 00000110, 00001100, 00000101, and 00001110.

It should be noted that the correspondence listed in Table 4 is obtained through simulation operation, so that the K second decoding paths determined based on the correspondence listed in Table 4 are K decoding paths having smallest path metric values in the third decoding paths corresponding to the first decoding path.

In the embodiment shown in FIG. 6, compared with the second feasible implementation of determining the second decoding path in S402, the second decoding path corresponding to the first decoding path can be determined without calculating the $2^n$ third decoding paths corresponding to the first decoding path or sorting the $2^n$ third decoding paths, thereby improving efficiency of determining the second decoding path.

With reference to FIG. 7A to FIG. 7D, the following describes in detail the SCL parallel decoding process shown in the foregoing method embodiments.

Figure 7C:
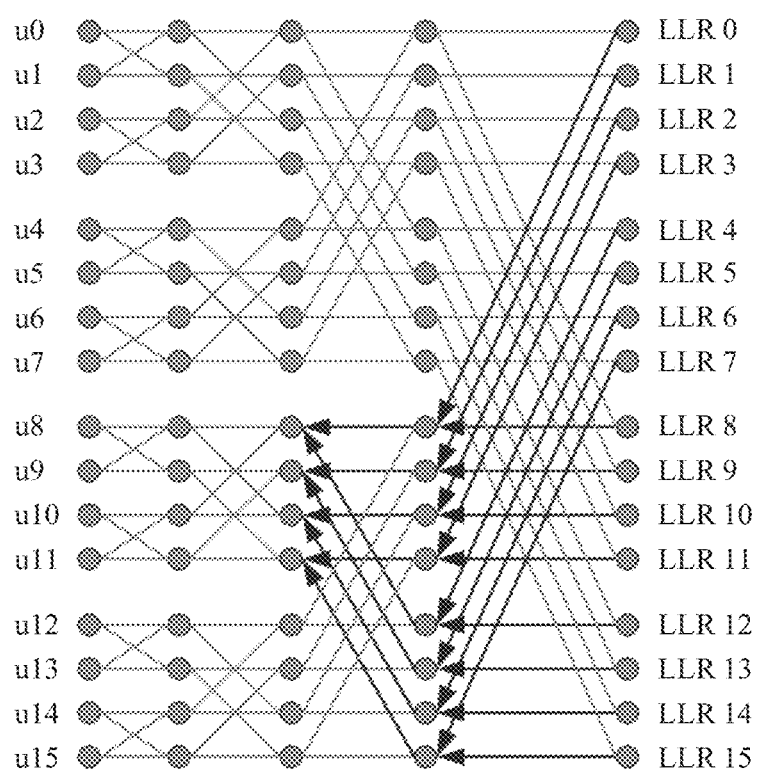
FIG. 7C is a schematic diagram of third-step decoding of SCL parallel decoding according to this application.
Figure 7D:
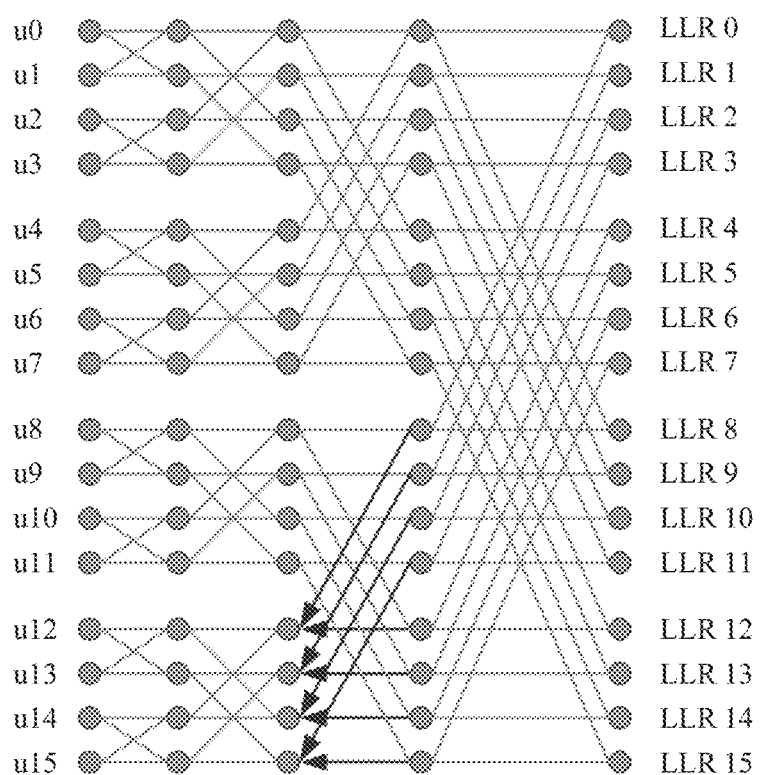
FIG. 7D is a schematic diagram of fourth-step decoding of SCL parallel decoding according to this application.

FIG. 7A is a schematic diagram of first-step decoding of SCL parallel decoding according to this application. FIG. 7B is a schematic diagram of second-step decoding of SCL parallel decoding according to this application. FIG. 7C is a schematic diagram of third-step decoding of SCL parallel decoding according to this application. FIG. 7D is a schematic diagram of fourth-step decoding of SCL parallel decoding according to this application.

Referring to FIG. 7A to FIG. 7D, a receive end receives 16 LLRs, and the 16 LLRs are respectively denoted as an LLR 0, an LLR 1, . . . , and an LLR 15. Correspondingly, a quantity of to-be-decoded bits is 16, and the 16 to-be-decoded bits are respectively denoted as u0, u1, . . . , and u15. The 16 to-be-decoded bits are divided into four groups, each group of to-be-decoded bits includes four to-be-decoded bits, and to-be-decoded bits included in the four groups of to-be-decoded bits are listed in Table 5.

TABLE 5

| First group of to-be-decoded bits | u0, u1, u2, and u3 |
|---|---|
| Second group of to-be-decoded bits | U4, u5, u6, and u7 |
| Third group of to-be-decoded bits | U8, u9, u10, and u11 |
| Fourth group of to-be-decoded bits | U12, u13, u14, and u15 |

Referring to FIG. 7A to FIG. 7D, a polar code butterfly decoding network includes five columns of LLRs (or five layers of LLRs). The first column of LLRs from left to right are the first-layer LLRs; the second column of LLRs are the second-layer LLRs; and so on. The fifth column of LLRs are the fifth-layer LLRs.

Referring to FIG. 7A, in the first-step decoding, the third-layer LLRs of the first group of to-be-decoded bits (u0 to u3) are calculated based on the LLR 0, the LLR 1, . . . , and the LLR 15. Then, LLRs of u0 to u3 are calculated in parallel by using an ML algorithm, a simplified SC algorithm, or the like, and a path metric value of each possible decoding path of the first group of to-be-decoded bits is calculated in parallel based on the LLRs of u0 to u3. Assuming that the first group of to-be-decoded bits includes four information bits, a quantity of all possible decoding paths of the first group of to-be-decoded bits is $2^4$, and all the possible decoding paths are respectively 000, 0001, 0010, 0011, 0100, 0101, 0110, 0111, 1000, 1001, 1010, 1011, 1100, 1101, 1110, and 1111. It is assumed that a quantity of reserved paths is 32. Because the quantity (16) of all the possible decoding paths of the first group of to-be-decoded bits is less than the quantity of reserved paths, the 16 paths are all determined as the reserved decoding paths of the first group of to-be-decoded bits.

Referring to FIG. 7B, in the second-step decoding, the third-layer LLRs of the second group of to-be-decoded bits (u4 to u7) are calculated based on the LLR 0, the LLR 1 . . . . , and the LLR 15. It is assumed that the second group of to-be-decoded bits includes four information bits. Assuming that $16*2^4=256$ is less than a first preset threshold, a decoding result of the second-step decoding may be determined by using a method in the current technology, that is, 16 third decoding paths of each of 16 first decoding paths are obtained, to obtain 256 third decoding paths, and 32 decoding paths are selected from the 256 third decoding paths as reserved decoding paths of the second group of to-be-decoded bits.

Referring to FIG. 7C, in the third-step decoding, the third-layer LLRs of the third group of to-be-decoded bits (u8 to u11) are calculated. Assuming that the third group of to-be-decoded bits includes four information bits and $32*2^4=512$ is greater than a first preset threshold, a reserved decoding path of the third group of to-be-decoded bits is determined by using the method shown in this application. Specifically, according to the method shown in the embodiment in FIG. 6, four modes corresponding to each first decoding path may be determined, and sorting needs to be performed for a maximum of $32*1=32$ times.

Four second decoding paths of each of a first decoding path 1 to a first decoding path 8 are determined based on four modes corresponding to each of the first decoding path 1 to the first decoding path 8, so that no sorting needs to be performed.

Two second decoding paths of each of a first decoding path 9 to a first decoding path 16 are determined based on four modes corresponding to each of the first decoding path 9 to the first decoding path 16, so that sorting needs to be performed for $8*4*2=64$ times.

One second decoding path of each of a first decoding path 17 to a first decoding path 32 is determined based on four modes corresponding to each of the first decoding path 17 to the first decoding path 32, so that sorting needs to be performed for $16*4=64$ times.

In the foregoing process, a total of 64 second decoding paths are determined, and 32 decoding paths having smallest path metric values are selected from the 64 second decoding paths as reserved decoding paths of an $i^t$ group of to-be-decoded bits based on path metric values of the 64 second decoding paths, so that sorting needs to be performed for $64*32=2048$ times, that is, sorting complexity in this application is 2048.

It can be learned from the foregoing descriptions that, in a process of the $i^{th}$-step decoding, sorting needs to be performed for a maximum of $32+64+64+2048=2208$ times.

However, in the current technology, in the $i^{th}$-step decoding, for each of the 32 first decoding paths in the $(i-1)^{th}$-step decoding, 16 decoding paths may be obtained through extension, so that a total of $32*16=512$ decoding paths can be obtained through extension. Then, the 512 decoding paths are sorted based on path metric values of the decoding paths, and 32 decoding paths in the $i^{th}$-step decoding are selected from the sorted 512 decoding paths. In this way, sorting needs to be performed for $512*32=16384$ times, that is, sorting complexity in the current technology is 16384.

It can be learned from the foregoing that, compared with the current technology, in this application, the sorting complexity can be greatly reduced, thereby improving decoding efficiency.

The fourth-step decoding is performed by using a method similar to that of the third-step decoding. After the fourth-step decoding, 32 reserved decoding paths may be obtained, and one decoding path is selected from 32 reserved decoding paths as a decoding result.

Figure 9:
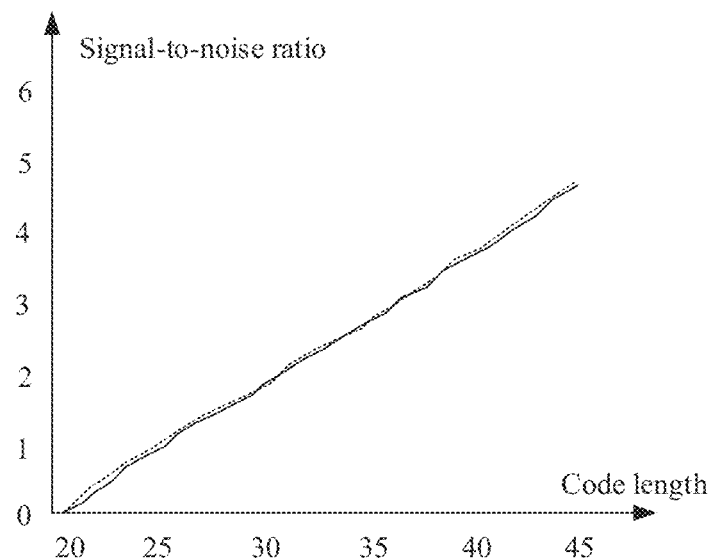
FIG. 9 is another schematic simulation diagram according to this application.

Based on any one of the foregoing embodiments, the following describes decoding efficiency in this application with reference to simulation data shown in FIG. 8 and FIG. 9.

FIG. 8 is a schematic simulation diagram according to this application. Referring to FIG. 8, a longitudinal direction represents a first decoding path, and path metric values of the first decoding path increase in ascending order from top to bottom; and a horizontal direction represents a branch path, and path metric values of the branch path increase in ascending order from left to right.

FIG. 8 includes elements in 32 rows and 16 columns. Elements in the $10^{th}$ to $16^{th}$ columns are all 0, and the $10^{th}$ to $16^{th}$ column are not shown in the figure. Each element represents a normalized probability that a decoding path including the first decoding path and the branch path is a real decoding path, and the probability is obtained through calculation by using a conventional method. That is, each probability is divided by 32, to obtain the normalized probability shown in FIG. 8.

It can be learned from FIG. 8 that, for a first decoding path 1 to a first decoding path 4, a probability that decoding paths corresponding to first four columns are real decoding paths is relatively large; for a first decoding path 5 to a first decoding path 24, a probability that decoding paths corresponding to first two columns are real decoding paths is relatively large; and for a first decoding path 25 to a first decoding path 32, a probability that a decoding path corresponding to a first column is a real decoding path is relatively large.

In this application, for the first decoding path 1 to the first decoding path 4, the decoding paths corresponding to the first four columns are selected as second decoding paths, and then a reserved decoding path is determined from the second decoding paths. This not only can reduce sorting complexity, but also can avoid omission of an actual decoding path, so that decoding accuracy is relatively high. Similarly, for the first decoding path 5 and the first decoding path 32, sorting complexity can be reduced, so that decoding accuracy is relatively high.

FIG. 9 is another schematic simulation diagram according to this application. Referring to FIG. 9, a horizontal axis represents a code length, and a longitudinal axis represents a signal-to-noise ratio.

Referring to FIG. 9, for any step of decoding, assuming that there are 64 paths obtained by extending $L_1$ first decoding paths and there are 32 reserved decoding paths, 32 decoding paths need to be selected from the 64 paths as the reserved decoding paths. In a process of selecting the 32 paths from the 64 paths, a dashed line in FIG. 9 is a signal-to-noise ratio of decoding performed by using T1 comparison units in the method in the current technology, and a solid line in FIG. 9 is a signal-to-noise ratio of decoding performed by using T2 comparison units in the method in this application. The signal-to-noise ratio indicates decoding performance. Therefore, it can be learned from Table 9 that, decoding performance in this application is close to decoding performance in the current technology, but T2 is approximately 5.8% of T1. That is, when the decoding performance in this application is close to the decoding performance in the current technology, a quantity of comparison units used in this application is approximately 5.8% of a quantity of comparison units used in the current technology. It can be learned that decoding complexity in this application is less than decoding complexity in the current technology.

Figure 10:
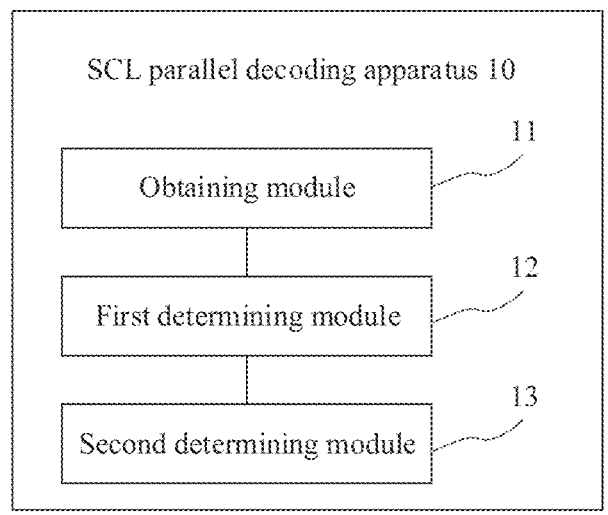
FIG. 10 is a schematic structural diagram of an SCL parallel decoding apparatus according to this application.

FIG. 10 is a schematic structural diagram of an SCL parallel decoding apparatus according to this application. The SCL parallel decoding apparatus may be disposed in a receiving device, and the receiving device may be a terminal device, a network device, or the like. Data received by the SCL parallel decoding apparatus 10 corresponds to P groups of to-be-decoded bits. Referring to FIG. 10, the SCL parallel decoding apparatus 10 includes an obtaining module 11, a first determining module 12, and a second determining module 13.

The obtaining module 11 is configured to obtain $L_1$ first decoding paths of an $(i-1)^{th}$ group of to-be-decoded bits, where i is an integer, P is an integer greater than 1, $1 < i \leq P$, and $L_1$ is a positive integer.

The first determining module 12 is configured to determine a second decoding path corresponding to each first decoding path, where in the $L_1$ first decoding paths, a quantity of second decoding paths corresponding to at least one first decoding path is different from a quantity of second decoding paths corresponding to another first decoding path, and a quantity of second decoding paths corresponding to each first decoding path is less than $2^n$, where n is a quantity of information bits included in an $i^{th}$ group of to-be-decoded bits.

The second determining module 13 is configured to determine at least one reserved decoding path of the $i^{th}$ group of to-be-decoded bits in second decoding paths corresponding to the $L_1$ first decoding paths, where the at least one reserved decoding path includes a decoding result of the $i^{th}$ group of to-be-decoded bits.

Optionally, the obtaining module 11 may perform S401 in the embodiment shown in FIG. 4.

Optionally, the first determining module 12 may perform S402 in the embodiment shown in FIG. 4 and S601 to S604 in the embodiment shown in FIG. 6.

Optionally, the second determining module 13 may perform S403 in the embodiment shown in FIG. 4.

It should be noted that the SCL parallel decoding apparatus shown in this application may perform the technical solutions shown in the foregoing method embodiments. Implementation principles and beneficial effects of the SCL parallel decoding apparatus are similar to those of the technical solutions. Details are not described herein again.

In a possible implementation, when a path metric value of an $x^{th}$ first decoding path is greater than or equal to a path metric value of a $y^{th}$ first decoding path, a quantity of second decoding paths corresponding to the $x^{th}$ first decoding path is less than or equal to a quantity of second decoding paths corresponding to the $y^{th}$ first decoding path, where x is a positive integer, $1 \leq x \leq L_1$, y is a positive integer, and $1 \leq y \leq L_1$.

In a possible implementation, the first determining module 12 is specifically configured to:

determine the second decoding path corresponding to the first decoding path based on a log likelihood ratio LLR array, of the first decoding path, input in $i^{th}$-step decoding, a location of a non information bit included in the $i^{th}$ group of to-be-decoded bits, and a value of the non information bit.

In a possible implementation, the first determining module 12 is specifically configured to:

determine a target mode based on the LLR array, of the first decoding path, input in the $i^{th}$-step decoding, the location of the non information bit included in the $i^{th}$ group of to-be-decoded bits, and the value of the non information bit; and determine the second decoding path based on the target mode and the LLR array.

In a possible implementation, $L_1=32$, $n \leq 4$, and in the 32 first decoding paths, a quantity of second decoding paths corresponding to each of four first decoding paths is 4, a quantity of second decoding paths corresponding to each of 20 first decoding paths is 2, and a quantity of second decoding paths corresponding to each of eight first decoding paths is 1.

In a possible implementation, in the 32 first decoding paths sorted in ascending order of path metric values, a quantity of second decoding paths corresponding to each of the first to fourth first decoding paths is 4, a quantity of second decoding paths corresponding to each of the fifth to $24^{th}$ first decoding paths is 2, and a quantity of second decoding paths corresponding to each of the $25^{th}$ to $32^{nd}$ first decoding paths is 1.

In a possible implementation, $L_1=32$, $n \leq 4$, and in the 32 first decoding paths, a quantity of second decoding paths corresponding to each of eight first decoding paths is 4, a quantity of second decoding paths corresponding to each of eight first decoding paths is 2, and a quantity of second decoding paths corresponding to each of 16 first decoding paths is 1.

In a possible implementation, in the 32 first decoding paths sorted in ascending order of path metric values, a quantity of second decoding paths corresponding to each of the first to eighth first decoding paths is 4, a quantity of second decoding paths corresponding to each of the ninth to $16^{th}$ first decoding paths is 2, and a quantity of second decoding paths corresponding to each of the $17^{th}$ to $32^{nd}$ first decoding paths is 1.

In a possible implementation, the first determining module 12 is specifically configured to:

determine a lighted array and a symbolic parameter S based on the LLR array, the location of the non information bit, and the value of the non information bit; and determine the target mode based on the lighted array and the symbolic parameter S.

In a possible implementation, a group of to-be-decoded bits includes four to-be-decoded bits; and when a quantity of non information bits is 1 and the non information bit occupies the first location, the lighted array includes 1111;

when a quantity of non information bits is 1 and the non information bit occupies the second location, the lighted array includes 1100, 1010, 1001, 0110, 0101, and 0011;

when a quantity of non information bits is 1 and the non information bit occupies the third location, the lighted array includes 1100, 1010, 1001, 0110, 0101, and 0011; or when a quantity of non information bits is 1 and the non information bit occupies the fourth location, the lighted array includes 1000, 0100, 0010, and 0001; and when a quantity of non information bits is 0, at least one mode includes 0000, 1000, 0100, 0010, and 1100;

when the lighted array is 1111 and S is 0, at least one mode includes 0000, 1100, 1010, 1001, and 0110;

when the lighted array is 1111 and S is 1, at least one mode includes 1000, 0100, 0010, 0001, and 1110;

when the lighted array is 1100 and S is 0, at least one mode includes 0000, 0010, 1100, 0001, and 1110;

when the lighted array is 1100 and S is 1, at least one mode includes 1000, 1010, 0100, 1001, and 0110;

when the lighted array is 1010 and S is 0, at least one mode includes 0000, 0100, 0001, and 1010;

when the lighted array is 1010 and S is 1, at least one mode includes 1000, 1100, 0010, 1001, and 0110;

when the lighted array is 1001 and S is 0, at least one mode includes 0000, 0100, 0010, 0110, and 1001:

when the lighted array is 1001 and S is 1, at least one mode includes 1000, 1100, 1010, 1110, and 0001;

when the lighted array is 0110 and S is 0, at least one mode includes 0000, 1000, 0001, 1001, 0110, and 1110;

when the lighted array is 0110 and S is 1, at least one mode includes 0100, 1100, 0010, and 1010;

when the lighted array is 0101 and S is 0, at least one mode includes 0000, 1000, 0010, and 1010;

when the lighted array is 0101 and S is 1, at least one mode includes 0100, 1100, 0110, 1110, 0001, and 1001;

when the lighted array is 0011 and S is 0, at least one mode includes 0000, 1000, 0100, and 1100;

when the lighted array is 0011 and S is 1, at least one mode includes 0010, 1010, 0110, 1110, 0001, and 1001:

when the lighted array is 1000 and S is 0, at least one mode includes 0000, 0100, 0010, 0110, and 0001;

when the lighted array is 1000 and S is 1, at least one mode includes 1000, 1100, 1010, 1110, and 1001;

when the lighted array is 0100 and S is 0, at least one mode includes 0000, 1000, 0010, 1010, and 0001;

when the lighted array is 0100 and S is 1, at least one mode includes 0100, 1100, 0110, 1110, and 0101;

when the lighted array is 0010 and S is 0, at least one mode includes 0000, 1000, 0100, 1100, and 0001;

when the lighted array is 0010 and S is 1, at least one mode includes 0010, 1010, 0110, 1110, and 0011;

when the lighted array is 0001 and S is 0, at least one mode includes 0000, 1000, 0100, 1100, and 0010; or when the lighted array is 0001 and S is 1, at least one mode includes 0001, 1001, 0101, 1101, and 0011.

It should be noted that the SCL parallel decoding apparatus shown in this application may perform the technical solutions shown in the foregoing method embodiments. Implementation principles and beneficial effects of the SCL parallel decoding apparatus are similar to those of the technical solutions. Details are not described herein again.

Figure 11:
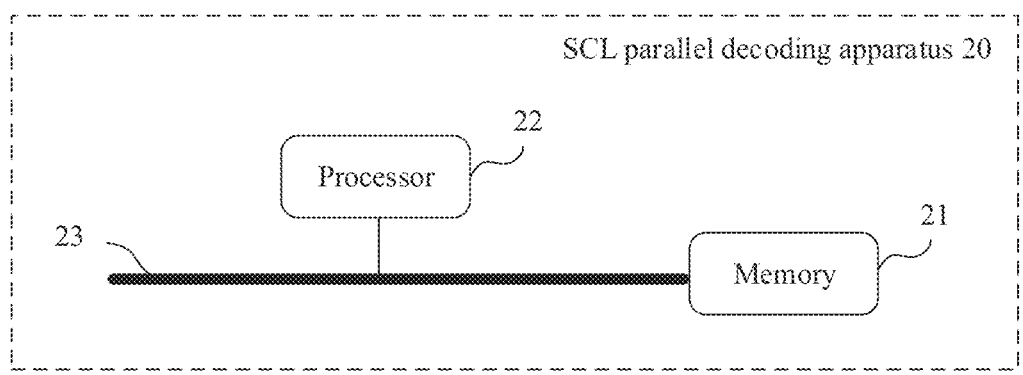
FIG. 11 is a schematic structural diagram of hardware of an SCL parallel decoding apparatus according to this application.

FIG. 11 is a schematic structural diagram of hardware of an SCL parallel decoding apparatus according to this application. Referring to FIG. 11, the SCL parallel decoding apparatus 20 includes a memory 21 and a processor 22, where the memory 21 communicates with the processor 22. For example, the memory 21 communicates with the processor 22 by using a communications bus 23. The memory 21 is configured to store a computer program, and the processor 22 executes the computer program to implement the method shown in the foregoing embodiments.

Optionally, the SCL parallel decoding apparatus may further include a transmitter and/or a receiver.

Optionally, the processor may be a central processing unit (CPU), or may be another general purpose processor, a digital signal processor (DSP), an application-specific integrated circuit (ASIC), or the like. The general purpose processor may be a microprocessor, or the processor may be any conventional processor or the like. The steps (S201 to S203 in the embodiment shown in FIG. 2, S301 to S303 in the embodiment shown in FIG. 3, S401 to S403 in the embodiment shown in FIG. 4, and S601 to S604 in the embodiment shown in FIG. 6) of the method disclosed in this application may be directly performed and completed by a hardware processor, or may be performed and completed through a combination of hardware in the processor and a software module.

This application provides a storage medium. The storage medium is configured to store a computer program, and the computer program is used to implement the SCL parallel decoding method according to any one of the foregoing method embodiments.

This application provides a chip. The chip is configured to support a receiving device (for example, a terminal device or a network device) in implementing a function (for example, obtaining a first decoding path, determining a second decoding path, or determining a reserved decoding path) in the embodiments of this application. The chip is specifically used in a chip system. The chip system may include the chip, or may include the chip and another discrete device. When the chip in the receiving device implements the foregoing method, the chip includes a processing unit. Further, the chip may further include a communications unit. The processing unit may be, for example, a processor. When the chip includes the communications unit, the communications unit may be, for example, an input/output interface, a pin, or a circuit. The processing unit performs all or some actions performed by processing modules (for example, the obtaining module, the first determining module, and the second determining module in FIG. 10) in the embodiments of this application. The communications unit may perform a corresponding receiving or sending action, for example, receive to-be-decoded bits before the obtaining module obtains $L_1$ first decoding paths of an $(i-1)^{th}$ group of to-be-decoded bits. In another specific embodiment, the processing module of the receiving device in this application may be the processing unit of the chip, and a receiving module or a sending module of a control device may be the communications unit of the chip.

All or some of the steps of the method embodiments may be implemented by hardware related to program instructions. The foregoing program may be stored in a readable memory. When the program is executed, the steps in the foregoing method embodiments are performed. The foregoing memory (storage medium) includes: a read-only memory (ROM), a RAM, a flash memory, a hard disk, a solid-state drive, a magnetic tape, a floppy disk, an optical disc, and any combination thereof.

The embodiments of this application are described with reference to the flowcharts and/or block diagrams of the method, the device (system), and the computer program product according to the embodiments of this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a special-purpose computer, an embedded processor, or a processing unit of another programmable data processing device to generate a machine, so that instructions executed by the computer or the processing unit of the another programmable data processing device generate an apparatus for implementing a specified function in one or more processes in the flowcharts and/or in one or more blocks in the block diagrams.

These computer program instructions may alternatively be stored in a computer-readable memory that can instruct a computer or another programmable data processing device to work in a specific manner, so that the instructions stored in the computer-readable memory generate an artifact that includes an instruction apparatus. The instruction apparatus implements a specified function in one or more processes in the flowcharts and/or in one or more blocks in the block diagrams.

The computer program instructions may alternatively be loaded onto a computer or another programmable data processing device, so that a series of operations and steps are performed on the computer or another programmable device, thereby generating computer-implemented processing. Therefore, the instructions executed on the computer or the another programmable device provide steps for implementing a specified function in one or more processes in the flowcharts and/or in one or more blocks in the block diagrams.

It is clear that a person skilled in the art can make various modifications and variations to the embodiments of this application without departing from the spirit and scope of this application. This application is intended to cover these modifications and variations provided that they fall within the scope of protection defined by the following claims and their equivalent technologies.

In this application, the term "including" and a variant thereof may refer to non-limitative inclusion; and the term "or" and a variant thereof may refer to "and/or". In this application, the terms "first", "second", and the like are intended to distinguish between similar objects but do not necessarily indicate a specific order or sequence. In this application, "a plurality of" means two or more than two. The term "and/or" describes an association relationship for describing associated objects and represents that three relationships may exist. For example, A and/or B may represent the following three cases: Only A exists, both A and B exist, and only B exists. The character "/" generally indicates an "or" relationship between the associated objects.

What is claimed is:

1. A decoding method, wherein the method comprises:
   receiving, by a receiving device in a communications system, data corresponding to P groups of to-be-decoded bits from a sending device, wherein P is an integer greater than 1; and
   decoding, by the receiving device, an $i^{th}$ group in the P groups of to-be-decoded bits, wherein i is an integer, $1<i\leq P$, and decoding the $i^{th}$ group comprising:
   obtaining $L_1$ first decoding paths of an $(i-1)^{th}$ group of to-be-decoded bits, wherein $L_1$ is a positive integer;
   determining at least one second decoding path corresponding to each first decoding path, wherein in the $L_1$ first decoding paths, a quantity of second decoding paths corresponding to at least one first decoding path is different from a quantity of second decoding paths corresponding to another first decoding path, wherein a quantity of second decoding paths corresponding to each first decoding path is less than $2^n$, and wherein n is a quantity of information bits comprised in an $i^{th}$ group of to-be-decoded bits; and
   determining at least one reserved decoding path of the $i^{th}$ group of to-be-decoded bits in second decoding paths corresponding to the $L_1$ first decoding paths, wherein the at least one reserved decoding path comprises a decoding result of the $i^{th}$ group of to-be-decoded bits.

2. The method according to claim 1, wherein when a path metric value of an $x^{th}$ first decoding path is greater than or equal to a path metric value of a $y^{th}$ first decoding path, a quantity of second decoding paths corresponding to the $x^{th}$ first decoding path is less than or equal to a quantity of second decoding paths corresponding to the $y^{th}$ first decoding path, and wherein x is a positive integer, $1\leq x\leq L_1$, y is a positive integer, and $1\leq y\leq L_1$.

3. The method according to claim 2, wherein determining the at least one second decoding path corresponding to each first decoding path comprises:
   determining the at least one second decoding path corresponding to the first decoding path based on a log likelihood ratio (LLR) array, of the first decoding path, input in $i^{th}$-step decoding, a location of a non information bit comprised in the $i^{th}$ group of to-be-decoded bits, and a value of the non information bit.

4. The method according to claim 3, wherein determining the at least one second decoding path corresponding to the first decoding path based on the LLR array, of the first decoding path, the input in $i^{th}$-step decoding, the location of the non information bit comprised in the $i^{th}$ group of to-be-decoded bits, and the value of the non information bit comprises:
   determining a target mode based on the LLR array, of the first decoding path, the input in the $i^{th}$-step decoding, the location of the non information bit comprised in the $i^{th}$ group of to-be-decoded bits, and the value of the non information bit; and
   determining the at least one second decoding path based on the target mode and the LLR array.

5. The method according to claim 1, wherein $L_1=32$, $n\leq 4$, and in the 32 first decoding paths, a quantity of second decoding paths corresponding to each of four first decoding paths is 4, a quantity of second decoding paths corresponding to each of 20 first decoding paths is 2, and a quantity of second decoding paths corresponding to each of eight first decoding paths is 1.

6. The method according to claim 5, wherein in the 32 first decoding paths sorted in ascending order of path metric values, a quantity of second decoding paths corresponding to each of the first to fourth first decoding paths is 4, a quantity of second decoding paths corresponding to each of the fifth to $24^{th}$ first decoding paths is 2, and a quantity of second decoding paths corresponding to each of the $25^{th}$ to $32^{nd}$ first decoding paths is 1.

7. The method according to claim 1, wherein $L_1=32$, $n\leq 4$, and in the 32 first decoding paths, a quantity of second decoding paths corresponding to each of eight first decoding paths is 4, a quantity of second decoding paths corresponding to each of eight first decoding paths is 2, and a quantity of second decoding paths corresponding to each of 16 first decoding paths is 1.

8. The method according to claim 7, wherein in the 32 first decoding paths sorted in ascending order of path metric values, a quantity of second decoding paths corresponding to each of the first to eighth first decoding paths is 4, a quantity of second decoding paths corresponding to each of the ninth to $16^{th}$ first decoding paths is 2, and a quantity of second decoding paths corresponding to each of the $17^{th}$ to $32^{nd}$ first decoding paths is 1.

9. The method according to claim 4, wherein determining the target mode based on the LLR array, of the first decoding path, the input in the $i^{th}$-step decoding, the location of the non information bit comprised in the $i^{th}$ group of to-be-decoded bits, and the value of the non information bit comprises:
  determining a lighted array and a symbolic parameter S based on the LLR array, the location of the non information bit, and the value of the non information bit; and
  determining the target mode based on the lighted array and the symbolic parameter S.

10. The method according to claim 9, wherein a group of to-be-decoded bits comprises four to-be-decoded bits; and
  when a quantity of non information bits is 1 and the non information bit occupies the first location, the lighted array comprises 1111;
  when a quantity of non information bits is 1 and the non information bit occupies the second location, the lighted array comprises 1100, 1010, 1001, 0110, 0101, and 0011;
  when a quantity of non information bits is 1 and the non information bit occupies the third location, the lighted array comprises 1100, 1010, 1001, 0110, 0101, and 0011; or
  when a quantity of non information bits is 1 and the non information bit occupies the fourth location, the lighted array comprises 1000, 0100, 0010, and 0001; and
  when a quantity of non information bits is 0, at least one mode comprises 0000, 1000, 0100, 0010, and 1100;
  when the lighted array is 1111 and S is 0, at least one mode comprises 0000, 1100, 1010, 1001, and 0110;
  when the lighted array is 1111 and S is 1, at least one mode comprises 1000, 0100, 0010, 0001, and 1110;
  when the lighted array is 1100 and S is 0, at least one mode comprises 0000, 0010, 1100, 0001, and 1110;
  when the lighted array is 1100 and S is 1, at least one mode comprises 1000, 1010, 0100, 1001, and 0110;
  when the lighted array is 1010 and S is 0, at least one mode comprises 0000, 0100, 0001, and 1010;
  when the lighted array is 1010 and S is 1, at least one mode comprises 1000, 1100, 0010, 1001, and 0110;
  when the lighted array is 1001 and S is 0, at least one mode comprises 0000, 0100, 0010, 0110, and 1001;
  when the lighted array is 1001 and S is 1, at least one mode comprises 1000, 1100, 1010, 1110, and 0001;
  when the lighted array is 0110 and S is 0, at least one mode comprises 0000, 1000, 0001, 1001, 0110, and 1110;
  when the lighted array is 0110 and S is 1, at least one mode comprises 0100, 1100, 0010, and 1010;
  when the lighted array is 0101 and S is 0, at least one mode comprises 0000, 1000, 0010, and 1010;
  when the lighted array is 0101 and S is 1, at least one mode comprises 0100, 1100, 0110, 1110, 0001, and 1001;
  when the lighted array is 0011 and S is 0, at least one mode comprises 0000, 1000, 0100, and 1100;
  when the lighted array is 0011 and S is 1, at least one mode comprises 0010, 1010, 0110, 1110, 0001, and 1001;
  when the lighted array is 1000 and S is 0, at least one mode comprises 0000, 0100, 0010, 0110, and 0001;
  when the lighted array is 1000 and S is 1, at least one mode comprises 1000, 1100, 1010, 1110, and 1001;
  when the lighted array is 0100 and S is 0, at least one mode comprises 0000, 1000, 0010, 1010, and 0001;
  when the lighted array is 0100 and S is 1, at least one mode comprises 0100, 1100, 0110, 1110, and 0101;
  when the lighted array is 0010 and S is 0, at least one mode comprises 0000, 1000, 0100, 1100, and 0001;
  when the lighted array is 0010 and S is 1, at least one mode comprises 0010, 1010, 0110, 1110, and 0011;
  when the lighted array is 0001 and S is 0, at least one mode comprises 0000, 1000, 0100, 1100, and 0010; or
  when the lighted array is 0001 and S is 1, at least one mode comprises 0001, 1001, 0101, 1101, and 0011.

11. The method according to claim 1, wherein:
  the communications system includes a narrowband internet of things (NB-IoT) system, a long term evolution (LTE) system, or a new radio (NR) system;
  the sending device is a terminal device and the receiving device is a network device; or
  the sending device is a network device and the receiving device is a terminal device.

12. A decoding apparatus, wherein the apparatus comprises at least one processor and one or more memories coupled to the at least one processor and storing programming instructions for execution by the at least one processor to:
  receive, from a sending device in a communications system, data corresponds to P groups of to-be-decoded bits, wherein P is an integer greater than 1; and
  decode an $i^{th}$ group in the P groups of to-be-decoded bits, wherein i is an integer, $1<i\leq P$, and decoding the $i^{th}$ group comprising:
  obtaining $L_1$ first decoding paths of an $(i-1)^{th}$ group of to-be-decoded bits, wherein $L_1$ is a positive integer;
  determining at least one second decoding path corresponding to each first decoding path, wherein in the $L_1$ first decoding paths, a quantity of second decoding paths corresponding to at least one first decoding path is different from a quantity of second decoding paths corresponding to another first decoding path, wherein a quantity of second decoding paths corresponding to each first decoding path is less than $2^n$, and wherein n is a quantity of information bits comprised in an $i^{th}$ group of to-be-decoded bits; and determining at least one reserved decoding path of the $i^{th}$ group of to-be-decoded bits in second decoding paths corresponding to the $L_1$ first decoding paths, wherein the at least one reserved decoding path comprises a decoding result of the $i^{th}$ group of to-be-decoded bits.

13. The apparatus according to claim 12, wherein when a path metric value of an $x^{th}$ first decoding path is greater than or equal to a path metric value of a $y^{th}$ first decoding path, a quantity of second decoding paths corresponding to the $x^{th}$ first decoding path is less than or equal to a quantity of second decoding paths corresponding to the $y^{th}$ first decoding path, and wherein x is a positive integer, $1 \leq x \leq L_1$, y is a positive integer, and $1 \leq y \leq L_1$.

14. The apparatus according to claim 13, wherein the programming instructions are for execution by the at least one processor to:

determine the at least one second decoding path corresponding to the first decoding path based on a log likelihood ratio (LLR) array, of the first decoding path, input in $i^{th}$-step decoding, a location of a non information bit comprised in the $i^{th}$ group of to-be-decoded bits, and a value of the non information bit.

15. The apparatus according to claim 14, wherein the programming instructions are for execution by the at least one processor to:

determine a target mode based on the LLR array, of the first decoding path, the input in the $i^{th}$-step decoding, the location of the non information bit comprised in the $i^{th}$ group of to-be-decoded bits, and the value of the non information bit; and determine the at least one second decoding path based on the target mode and the LLR array.

16. The apparatus according to claim 12, wherein $L_1=32$, $n \leq 4$, and in the 32 first decoding paths, a quantity of second decoding paths corresponding to each of four first decoding paths is 4, a quantity of second decoding paths corresponding to each of 20 first decoding paths is 2, and a quantity of second decoding paths corresponding to each of eight first decoding paths is 1.

17. The apparatus according to claim 16, wherein in the 32 first decoding paths sorted in ascending order of path metric values, a quantity of second decoding paths corresponding to each of the first to fourth first decoding paths is 4, a quantity of second decoding paths corresponding to each of the fifth to $24^{th}$ first decoding paths is 2, and a quantity of second decoding paths corresponding to each of the $25^{th}$ to $32^{nd}$ first decoding paths is 1.

18. The apparatus according to claim 12, wherein $L_1=32$, $n \leq 4$, and in the 32 first decoding paths, a quantity of second decoding paths corresponding to each of eight first decoding paths is 4, a quantity of second decoding paths corresponding to each of eight first decoding paths is 2, and a quantity of second decoding paths corresponding to each of 16 first decoding paths is 1.

19. The apparatus according to claim 18, wherein in the 32 first decoding paths sorted in ascending order of path metric values, a quantity of second decoding paths corresponding to each of the first to eighth first decoding paths is 4, a quantity of second decoding paths corresponding to each of the ninth to $16^{th}$ first decoding paths is 2, and a quantity of second decoding paths corresponding to each of the $17^{th}$ to $32^{nd}$ first decoding paths is 1.

20. A non-transitory computer-readable storage media comprising instructions for decoding which, when executed by at least one processor of a receiving device, cause the receiving device to perform operations comprising:

receiving, from a sending device in a communications system, data corresponding to P groups of to-be-decoded bits, wherein P is an integer greater than 1; and decoding an $i^{th}$ group in the P groups of to-be-decoded bits, wherein i is an integer, $1 < i \leq P$, and decoding the $i^{th}$ group comprising:

obtaining $L_1$ first decoding paths of an $(i-1)^{th}$ group of to-be-decoded bits, wherein $L_1$ is a positive integer;

determining at least one second decoding path corresponding to each first decoding path, wherein in the $L_1$ first decoding paths, a quantity of second decoding paths corresponding to at least one first decoding path is different from a quantity of second decoding paths corresponding to another first decoding path, wherein a quantity of second decoding paths corresponding to each first decoding path is less than $2^n$, and wherein n is a quantity of information bits comprised in an $i^{th}$ group of to-be-decoded bits; and determining at least one reserved decoding path of the $i^{th}$ group of to-be-decoded bits in second decoding paths corresponding to the $L_1$ first decoding paths, wherein the at least one reserved decoding path comprises a decoding result of the $i^{th}$ group of to-be-decoded bits.

* * * * *